US012740448B2

(12) United States Patent
Chen et al.

(10) Patent No.: US 12,740,448 B2
(45) Date of Patent: Sep. 15, 2026

(54) DEFORMATION-RESISTANT INTERPOSER FOR A LOCAL SILICON INTERCONNECT AND METHODS FOR FORMING THE SAME

(71) Applicant: Taiwan Semiconductor Manufacturing Company Limited, Hsinchu (TW)

(72) Inventors: Min-Yu Chen, Kaohsiung City (TW); Po-Chen Lai, Hsinchu (TW); Ming-Chih Yew, Hsinchu City (TW); Shin-Puu Jeng, Po-Shan Village (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 575 days.

(21) Appl. No.: 18/189,299

(22) Filed: Mar. 24, 2023

(65) Prior Publication Data

US 2024/0321758 A1 Sep. 26, 2024

(51) Int. Cl.
*H01L 23/538* (2006.01)
*H10B 80/00* (2023.01)
(Continued)

(52) U.S. Cl.
CPC ............ *H10W 70/65* (2026.01); *H10B 80/00* (2023.02); *H10W 70/093* (2026.01); *H10W 70/095* (2026.01); *H10W 70/611* (2026.01); *H10W 70/635* (2026.01); *H10W 72/072* (2026.01); *H10W 90/00* (2026.01); *H10W 90/401* (2026.01); *H10P 72/74* (2026.01); *H10P 72/7424* (2026.01); *H10W 72/07236* (2026.01); *H10W 72/073* (2026.01); *H10W 72/241* (2026.01); *H10W 74/15* (2026.01); *H10W 90/724* (2026.01); *H10W 90/734* (2026.01)

(58) Field of Classification Search
None
See application file for complete search history.

(56) References Cited

U.S. PATENT DOCUMENTS

2021/0265313 A1* 8/2021 Chen ...................... H10D 1/692
2022/0068862 A1* 3/2022 Wu ......................... H10P 72/74
(Continued)

FOREIGN PATENT DOCUMENTS

TW 202244990 A 11/2022

OTHER PUBLICATIONS

TW Patent and Trademark Office; TW Application No. 112119066; Office Action mailed Jan. 16, 2024; 10 pages.

*Primary Examiner* — Long Pham
(74) *Attorney, Agent, or Firm* — The Marbury Law Group, PLLC

(57) ABSTRACT

A composite interposer includes a local-silicon-interconnect-containing (LSI-containing) interposer that includes a local silicon interconnect (LSI) bridge; and an organic interposer located on the LSI-containing interposer, including redistribution dielectric layers embedding redistribution wiring interconnects and a metallic counter-deformation structure. The metallic counter-deformation structure includes a plurality of metallic via structures; a first metallic plate located on a first side of the plurality of metallic via structures; and a second metallic plate located on a second side of the plurality metallic via structures and vertically spaced from the first metallic plate.

20 Claims, 29 Drawing Sheets

(51) Int. Cl.

| | |
|---|---|
| ***H10W 70/05*** | (2026.01) |
| ***H10W 70/60*** | (2026.01) |
| ***H10W 70/63*** | (2026.01) |
| ***H10W 70/65*** | (2026.01) |
| ***H10W 72/00*** | (2026.01) |
| ***H10W 90/00*** | (2026.01) |
| *H10P 72/70* | (2026.01) |
| *H10W 72/20* | (2026.01) |
| *H10W 74/15* | (2026.01) |

(56) References Cited

U.S. PATENT DOCUMENTS

| | | | | |
|---|---|---|---|---|
| 2022/0302003 | A1* | 9/2022 | Pan | H10W 70/685 |
| 2022/0375768 | A1* | 11/2022 | Sakurai | H10P 72/0402 |
| 2022/0375843 | A1* | 11/2022 | Jeng | H10W 70/611 |
| 2023/0042438 | A1* | 2/2023 | Hou | H10W 20/023 |

* cited by examiner

FIG. 7C
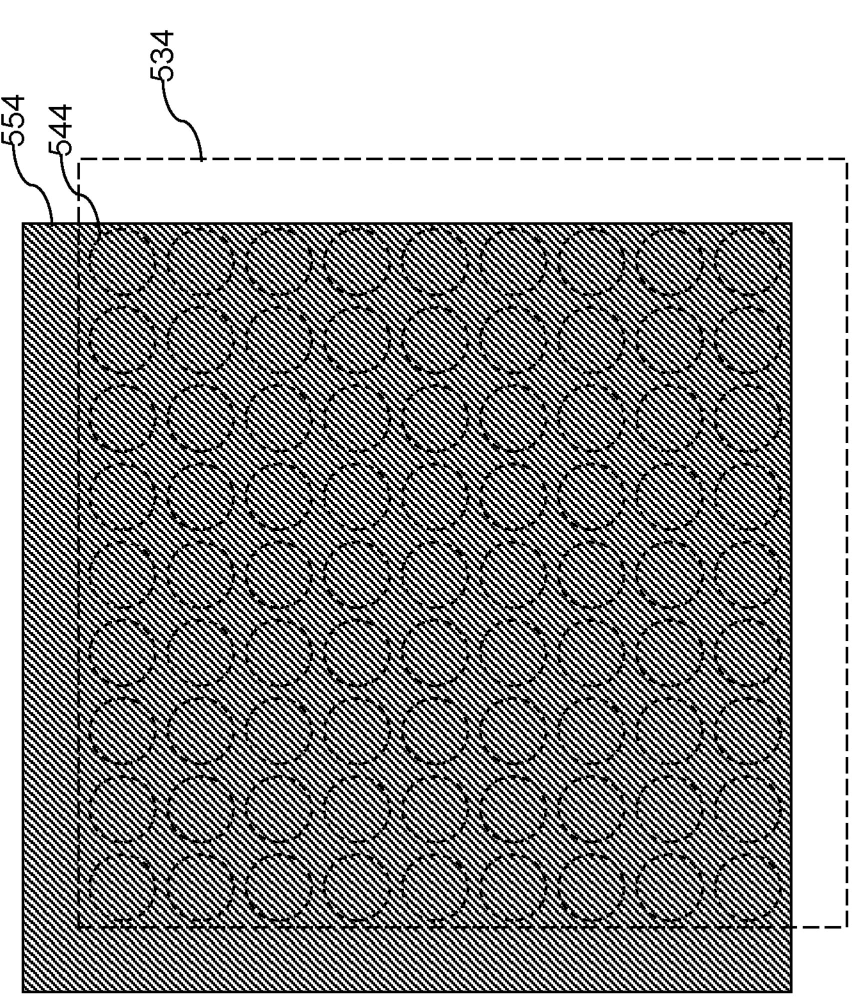
534
554
544

FIG. 7D
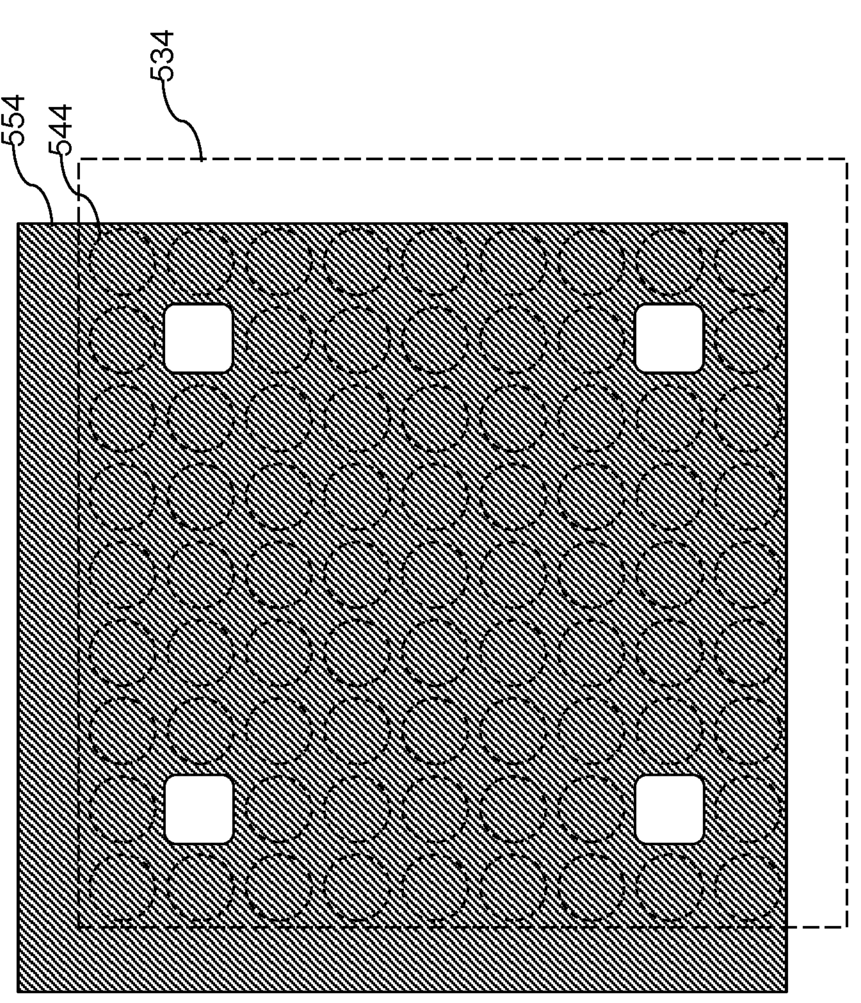
534
554
544

DEFORMATION-RESISTANT INTERPOSER FOR A LOCAL SILICON INTERCONNECT AND METHODS FOR FORMING THE SAME

BACKGROUND

Interposers are often thin, insulating sheets with a pattern of metal wires or traces on one or both sides. Interposers may be used to connect two or more printed circuit boards (PCBs) or other electronic components together. Local silicon interconnect bridges are small, thin structures made of silicon or another semiconductor material that can be used to connect the metal traces on an interposer to other electronic components, such as chips or vias on a PCB. Local silicon interconnect bridges may be incorporated into an interposer to provide shortened signal paths to and from multiple logic dies and to increase input-output bandwidth and power efficiency.

However, in instances in which local silicon interconnect bridges are used, they may be deformed by a process called thermal compression bonding. This process involves heating the interposer and the electronic component to be connected to it, and then applying pressure to bond them together. The heat and pressure may cause the local silicon interconnect bridges to deform and make a mechanical and electrical connection with the other component. The amount of deformation may depend on the specific materials used and the conditions of the thermal compression bonding process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7I are various plan views of metallic counter-deformation structures that may be used in the exemplary structure of FIGS. 5 and 6A-6E.

DETAILED DESCRIPTION

Figure 1:
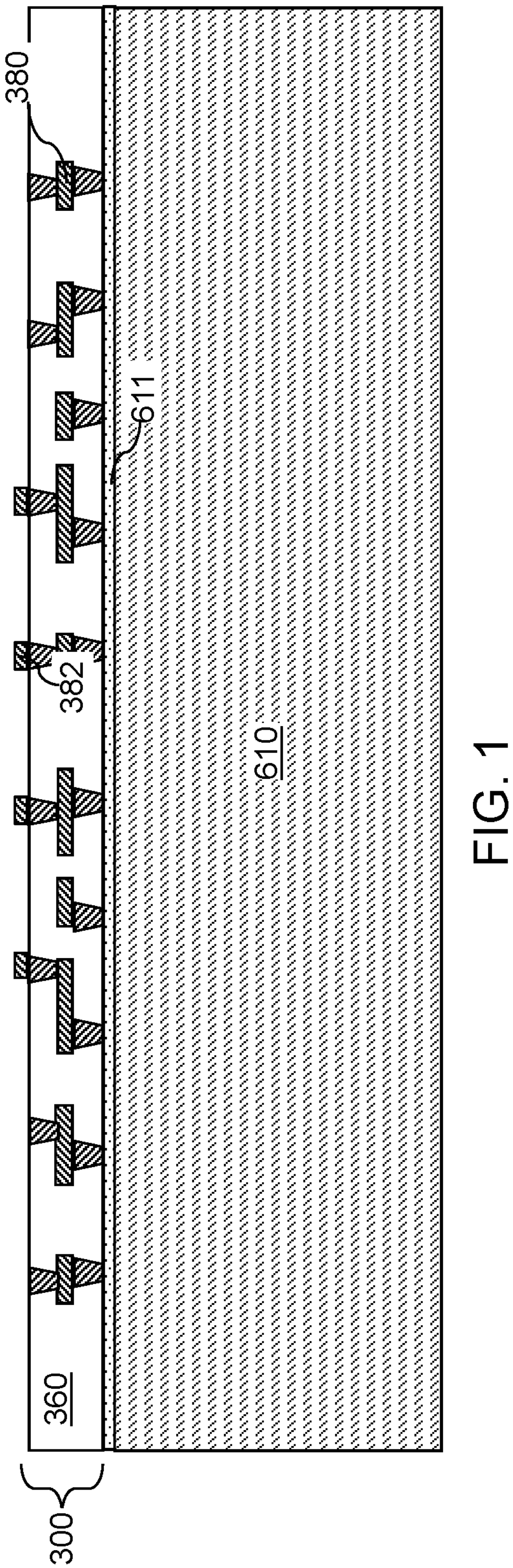
FIG. 1 is a vertical cross-sectional view of an intermediate structure after formation of a die-side organic interposer over a first carrier substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Fan-out packages are used to achieve high performance requirements such as low latency, high power efficiency, and large bandwidth. Some fan-out packages use an interposer with an embedded die, such as a local silicon interconnect bridge. Such embedded dies may be prone to die cracks or underfill delamination due to thermal expansion mismatch between the embedded die and a surrounding matrix material. Such embedded dies may also be prone to deformation during a thermal compression bonding process. This process involves heating the interposer and the electronic component to be connected to it, and then applying pressure to bond them together. The heat and pressure may cause the interposer and embedded dies therein to deform. The amount of deformation may depend on the specific materials used and the conditions of the thermal compression bonding process Various embodiments disclosed herein may be directed to semiconductor devices, and particularly to a fan-out package including a local silicon interconnect bridge embedded in a composite interposer containing metallic stress relief structures. Specifically, the metal density may be increased locally in regions of the composite interposer having an areal overlap with the local silicon interconnect bridge. The local increase in the metal density may be provided by counter-stress structures, which may be electrically inactive structures, i.e., dummy metallic structures, including a respective plurality of metal vias and a respective pair of metal plates having patterns that are laterally offset relative to each other. Stress generated around the local silicon interconnect bridge may be countered by the counter-stress structures, which redistributes applied mechanical stress over a wider support region and mitigates against the deformation of the composite interposer. The local increase in the density of metal around the peripheral regions of the local silicon interconnect bridge may increase the durability and reliability of the composite interposer. Various aspects of embodiments of the present disclosure are now described with reference to accompanying figures.

Referring to FIG. 1, an intermediate structure according to an embodiment of the present disclosure is illustrated. The intermediate structure includes a first carrier wafer 610. The first carrier wafer 610 may include an optically transparent substrate such as a glass substrate or a sapphire substrate, or may comprise a semiconductor substrate such as a silicon substrate. The diameter of the first carrier wafer 610 may be in a range from 150 mm to 450 mm, although lesser and greater diameters may be used. The thickness of the first carrier wafer 610 may be in a range from 500 microns to 2,000 microns, although lesser and greater thicknesses may also be used. Alternatively, the first carrier wafer 610 may be provided in a rectangular panel format. A first adhesive layer 611 may be applied to a front-side surface of the first carrier wafer 610. In one embodiment, the first adhesive layer 611 may be a light-to-heat conversion (LTHC) layer. Alternatively, the first adhesive layer 611 may include a thermally decomposing adhesive material.

A two-dimensional array of die-side organic interposers 300 may be formed over the first carrier substrate 610. The die-side organic interposers 300 are also referred to as first organic interposers. Each die-side organic interposer 300 comprises a respective redistribution structure. Specifically, a die-side organic interposer 300 may be formed within each unit area of repetition, which corresponds to the area of an interposer to be individually diced. Semiconductor dies are subsequently attached to the die-side organic interposers 300, and thus, the redistribution structures formed at this processing step are referred to as die-side organic interposers 300. While FIG. 1 illustrates a region within a unit area, one of ordinary skill in the art would understand that a repetition of the structure illustrated in FIG. 1 in two horizontal directions during manufacturing may occur.

Each die-side organic interposer 300 may include die-side redistribution dielectric layers 360, die-side redistribution wiring interconnects 380, and microbump structures 382 (i.e., bump structures to be used to contact local silicon interconnect bridges from the die side). The die-side redistribution dielectric layers 360 are also referred to as first redistribution dielectric layers. The die-side redistribution dielectric layers 360 include a respective dielectric polymer material such as polyimide (PI), benzocyclobutene (BCB), or polybenzobisoxazole (PBO). Each die-side redistribution dielectric layer 360 may be formed by spin coating and drying of the respective dielectric polymer material. The thickness of each die-side redistribution dielectric layer 360 may be in a range from 2 microns to 40 microns, such as from 4 microns to 20 microns. Each die-side redistribution dielectric layer 360 may be patterned, for example, by applying and patterning a respective photoresist layer thereabove, and by transferring the pattern in the photoresist layer into the die-side redistribution dielectric layer 360 using an etch process such as an anisotropic etch process. The photoresist layer may be subsequently removed, for example, by ashing.

The die-side redistribution wiring interconnects 380 may be embedded within the die-side redistribution dielectric layers. The die-side redistribution wiring interconnects 380 are also referred to as first redistribution wiring interconnects. Each of the die-side redistribution wiring interconnects 380 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the die-side redistribution wiring interconnects 380 may include copper, nickel, or copper and nickel. The thickness of the metallic fill material that is deposited for each die-side redistribution wiring interconnect 380 may be in a range from 2 microns to 40 microns, such as from 4 microns to 10 microns, although lesser or greater thicknesses may also be used. The total number of levels of wiring in each die-side organic interposer 300 (i.e., the levels of the die-side redistribution wiring interconnects 380) may be in a range from 1 to 10.

The microbump structures 382 are bump structures that are subsequently used to electrically connect local silicon interconnect bridges to be subsequently bonded to a respective one of the die-side organic interposers 300. The metallic fill material for the microbump structures 382 may include copper. Other suitable metallic fill materials may be within the contemplated scope of disclosure. The microbump structures 382 may have horizontal cross-sectional shapes of rectangles, rounded rectangles, or circles. Other horizontal cross-sectional shapes may be within the contemplated scope of disclosure. Typically, the microbump structures 382 may be configured for microbump bonding, and may have a thickness in a range from 5 microns to 100 microns, although lesser or greater thicknesses may also be used. In one embodiment, the microbump structures 382 may be formed as an array of microbumps (such as copper pillars) having a lateral dimension in a range from 10 microns to 50 microns, and having a pitch in a range from 20 microns to 100 microns.

Figure 2:
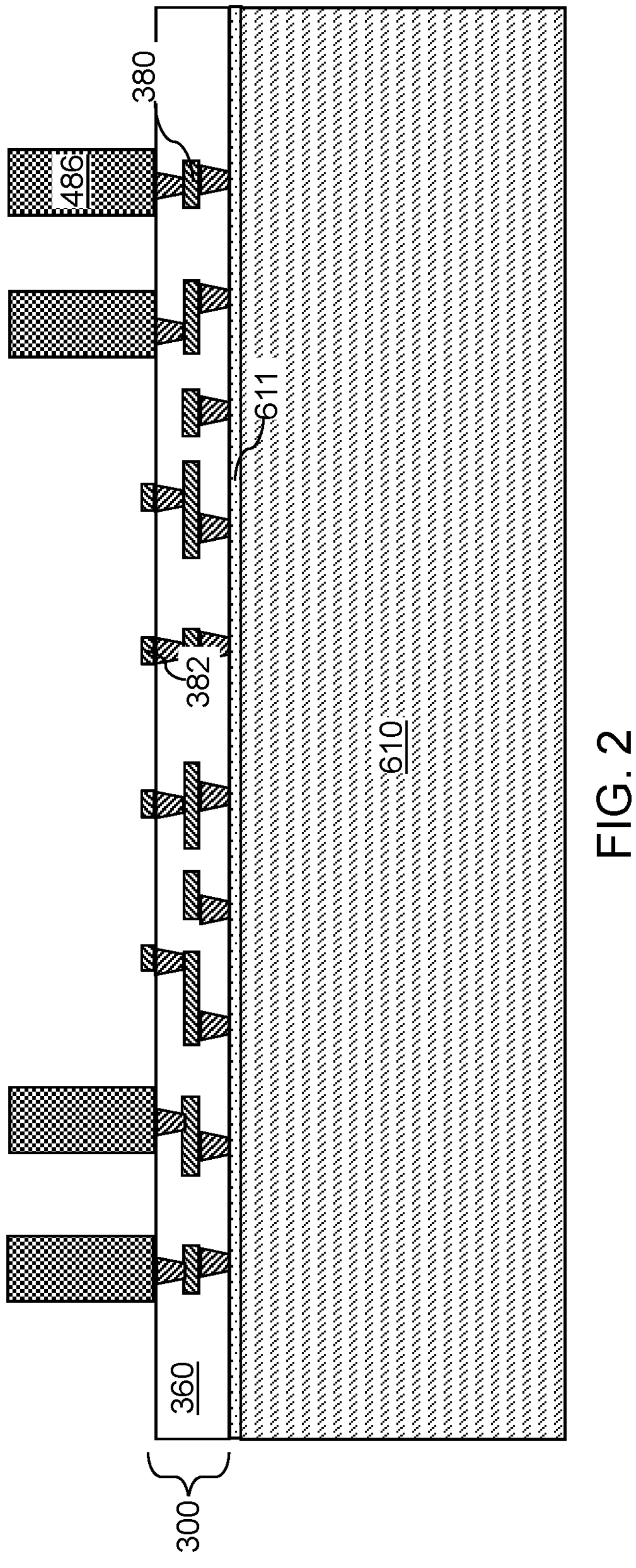
FIG. 2 is a vertical cross-sectional view of the intermediate structure after formation of through-integrated-fan-out-via structures (TIV structures) according to an embodiment of the present disclosure.

Referring to FIG. 2, a sacrificial matrix material layer (not shown) may be applied over the die-side organic interposers 300, and cylindrical cavities may be formed through the sacrificial matrix material layer. The sacrificial matrix material layer may comprise a polymer material such as polyimide. The pattern of the cylindrical cavities may be arranged around regions in which a local silicon interconnect (LSI) bridge is to be subsequently placed. As such, the cylindrical cavities may be formed around regions including the array of microbump structures 382. Generally, the pattern of the cylindrical cavities may be a periodic pattern that is arranged as a two-dimensional periodic array such as a rectangular array. Each unit pattern within the periodic pattern may have the same support region as the area of an interposer to be manufactured. In other words, a two-dimensional array of interposers may be formed by performing subsequent processing patterns. As such, a unit area that corresponds to the area of a single interposer includes a unit pattern for the cylindrical cavities.

At least one conductive material such as at least one metallic material (such as W, Mo, Ta, Ti, WN, TaN, TiN, etc.) may be deposited in the cylindrical cavities, and excess portions of the at least one conductive material may be removed from above the horizontal plane including the top surface of the sacrificial matrix material layer. Other suitable conductive materials may be within the contemplated scope of disclosure. Remaining portions of the at least one conductive material comprise through-integrated-fan-out-via structures 486, which are also referred to through-InFO-via structures 486 or TIV structures 486. The sacrificial matrix material layer may be subsequently removed, for example, by dissolving in a solvent or by ashing.

Figure 3:
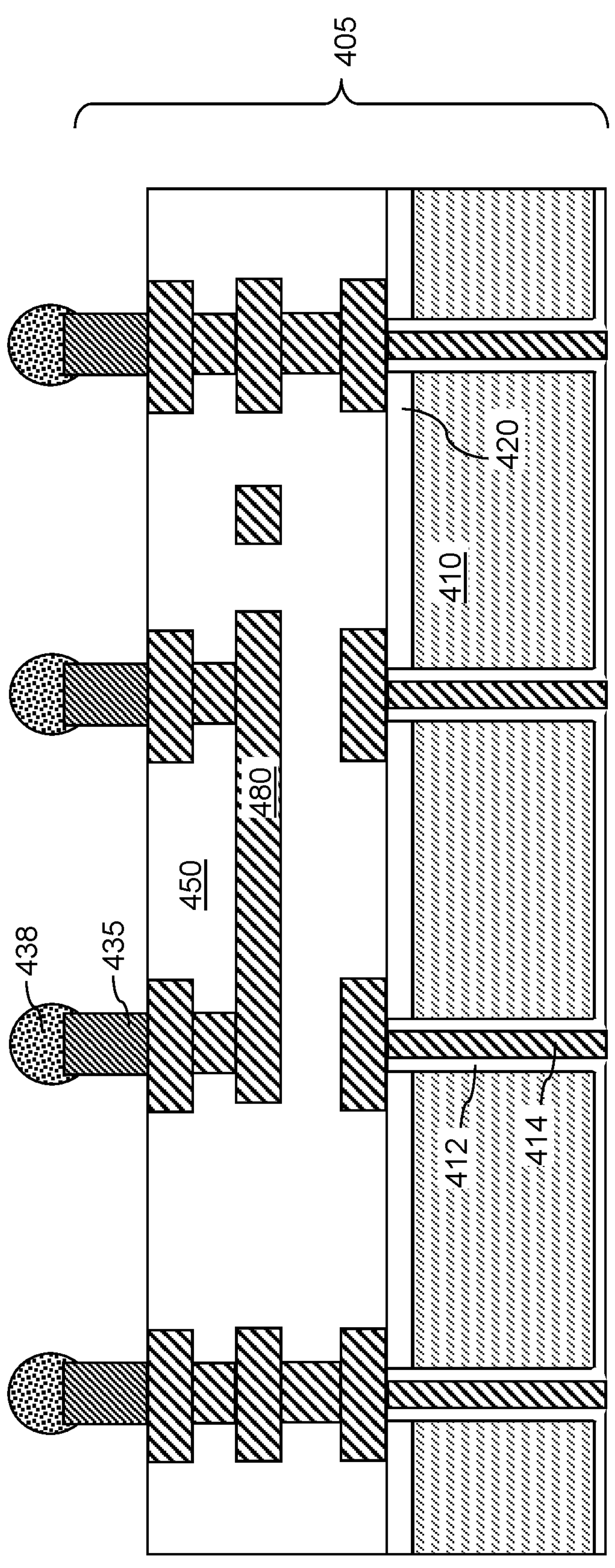
FIG. 3 is a vertical cross-sectional view of an exemplary local silicon interconnect (LSI) bridge that may be subsequently integrated into the intermediate structure.

Referring to FIG. 3, a local silicon interconnect bridge (LSI bridge) 405 is illustrated. The LSI bridge 405 includes a silicon substrate 410 (as thinned and diced during manufacturing of the local silicon interconnect bridge 405), through-substrate openings that vertically extend through the silicon substrate 410, a dielectric liner 412 that provides electrical isolation for through-silicon via structures 414, a planar dielectric material layer 420, and metal interconnect structures 480 embedded in dielectric material layers 450 and electrically connected to the through-silicon via structures 414 and/or electrically connected thereamongst. LSI microbump structures 435 configurated for microbump connection may be provided on the topmost metal interconnect structures 480. Optionally, a subset of the metal interconnect structures 480 may provide electrical connection to and from a subset of the LSI microbump structures 435. Solder material portions 438 may be applied to the LSI microbump structures 435 in preparation for a subsequent bonding process.

Figure 4:
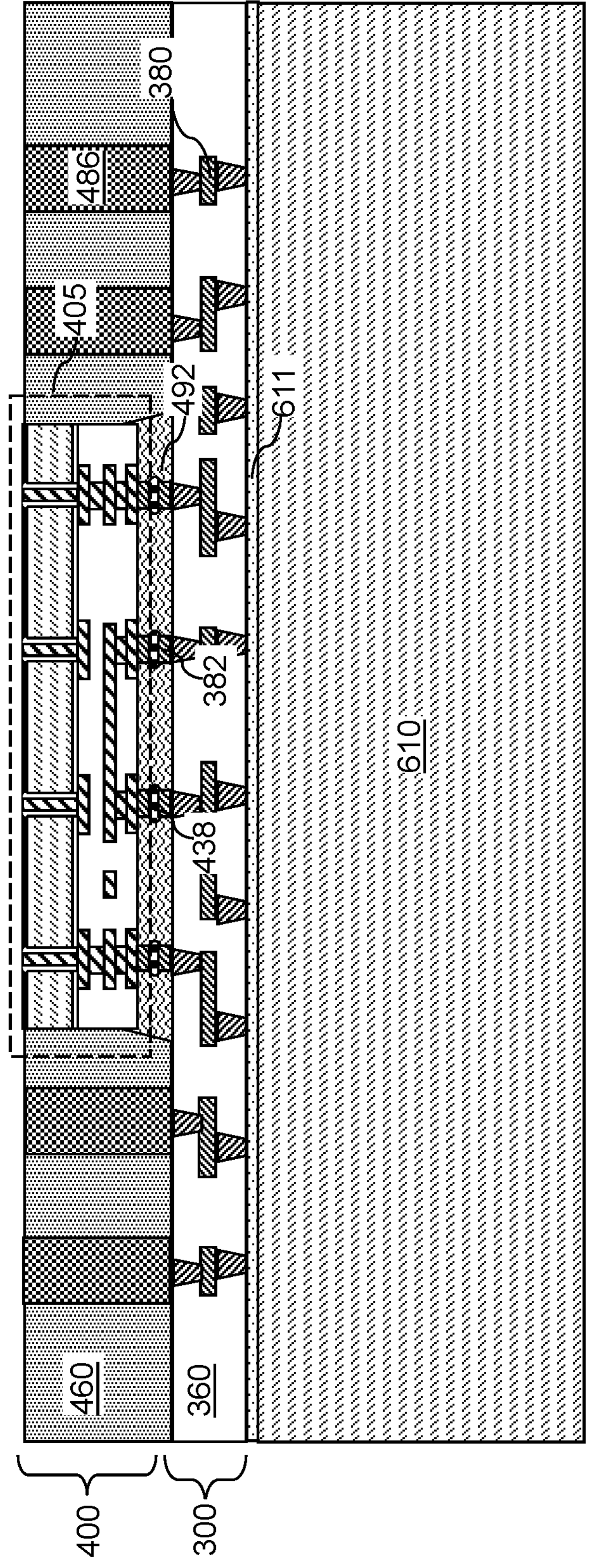
FIG. 4 is a vertical cross-sectional view of the intermediate structure after attaching an LSI bridge to the die-side organic interposer and formation of a molding compound interposer frame according to an embodiment of the present disclosure.

Referring to FIG. 4, the local silicon interconnect bridge (LSI bridge) 405 may be placed in vacant areas (i.e., areas that are not occupied by the through-integrated-fan-out-via structures 486). Generally, any type of LSI bridges 405 known in the art may be used. The microbump structures 435 on the LSI bridge 405 may be bonded to the microbump structures 382 on the die-side organic interposers 300 using an arrays of solder material portions 438 (which is shown in detail in FIG. 3). Each bonded combination of a microbump structure 435 on the LSI bridge 405, a microbump structure 382 on the die-side organic interposer 300, and a solder material portion is herein referred to as a microbump bonding structure. Generally, the LSI bridge 405 may be bonded to the die-side organic interposers 300 using arrays of microbump bonding structures. An underfill material portion 492 may be formed around the array of microbump bonding structures and the LSI bridge 405. While the present disclosure is described using an embodiment in which one LSI bridge 405 is attached to the die-side organic interposer 300, embodiments are expressly contemplated herein in which a plurality of LSI bridges 405 are attached to the die-side organic interposer 300.

An encapsulant, such as a molding compound (MC) may be applied to the gaps between the LSI bridges 405 and the TIV structures 486. The MC includes an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability. The exemplary structure comprises a reconstituted wafer in which a plurality of LSI bridges 405 are incorporated within layer of the MC.

The MC may be cured at a curing temperature to form an MC matrix, which is herein referred to as a first MC matrix or an interposer-level MC matrix. In embodiments in which underfill material portions are used to laterally surround the array of microbump bonding structures, such underfill material portions may be incorporated into the first MC matrix. The first MC matrix laterally encloses each of the bridges 405 and the TIV structures 486. The first MC matrix may be a continuous material layer that extends across the entirety of the area of the reconstituted wafer overlying the first carrier wafer 610. As such, the first MC matrix may include a plurality of molding compound (MC) interposer frames 460 that are laterally adjoined to one another. Each MC interposer frame 460 corresponds to a portion of the first MC matrix located within a unit area, i.e., an area of a single interposer to be subsequently formed. Each MC interposer frame 460 may be located within a respective unit area, and laterally surrounds a respective set of at least one bridges 405 and a respective array of TIV structures 486. Excess portions of the first MC matrix may be removed from above the horizontal plane including the top surfaces of the bridges 405 and the TIV structures 486 by a planarization process, which may use chemical mechanical planarization (CMP). Surfaces of the through-silicon via structures 414 may be physically exposed after the planarization process.

A reconstituted wafer is formed over the first carrier wafer 610. Each portion of the reconstituted wafer located within a unit area constitutes an in-process interposer, which includes a vertical stack of a die-side organic interposer 300 and a local-silicon-interconnect-containing interposer 400 (i.e., an LSI-containing interposer 400). As used herein, an "in-process" element or intermediate structure may refer to an element that is modified in a subsequent processing step, for example, by patterning, by change of material composition, and/or by addition or subtraction of a material portion. Each LSI-containing interposer 400 comprises a set of at least one LSI bridge 405, a set of TIV structures 486, and an MC interposer frame 460 (which is a portion of the first MC matrix).

Generally, a local-silicon-interconnect-containing (LSI-containing) interposer 400 may be provided within each unit area by forming a molding compound interposer frame 460 around at least one LSI bridge 405 such that a set of through-integrated-fan-out-via (TIV) structures 486 vertically extends through the molding compound interposer frame 460. The LSI-containing interposer 400 comprises an underfill material portion 492 laterally surrounding the array of solder material portions 438 and laterally surrounded by the molding compound interposer frame 460. The underfill material portion 492 is embedded within the molding compound interposer frame 460, and is herein referred to as an embedded underfill material portion 492. Generally, each LSI bridge 405 is bonded to the die-side organic interposer 300 through a respective array of solder material portions-438.

Figure 5:
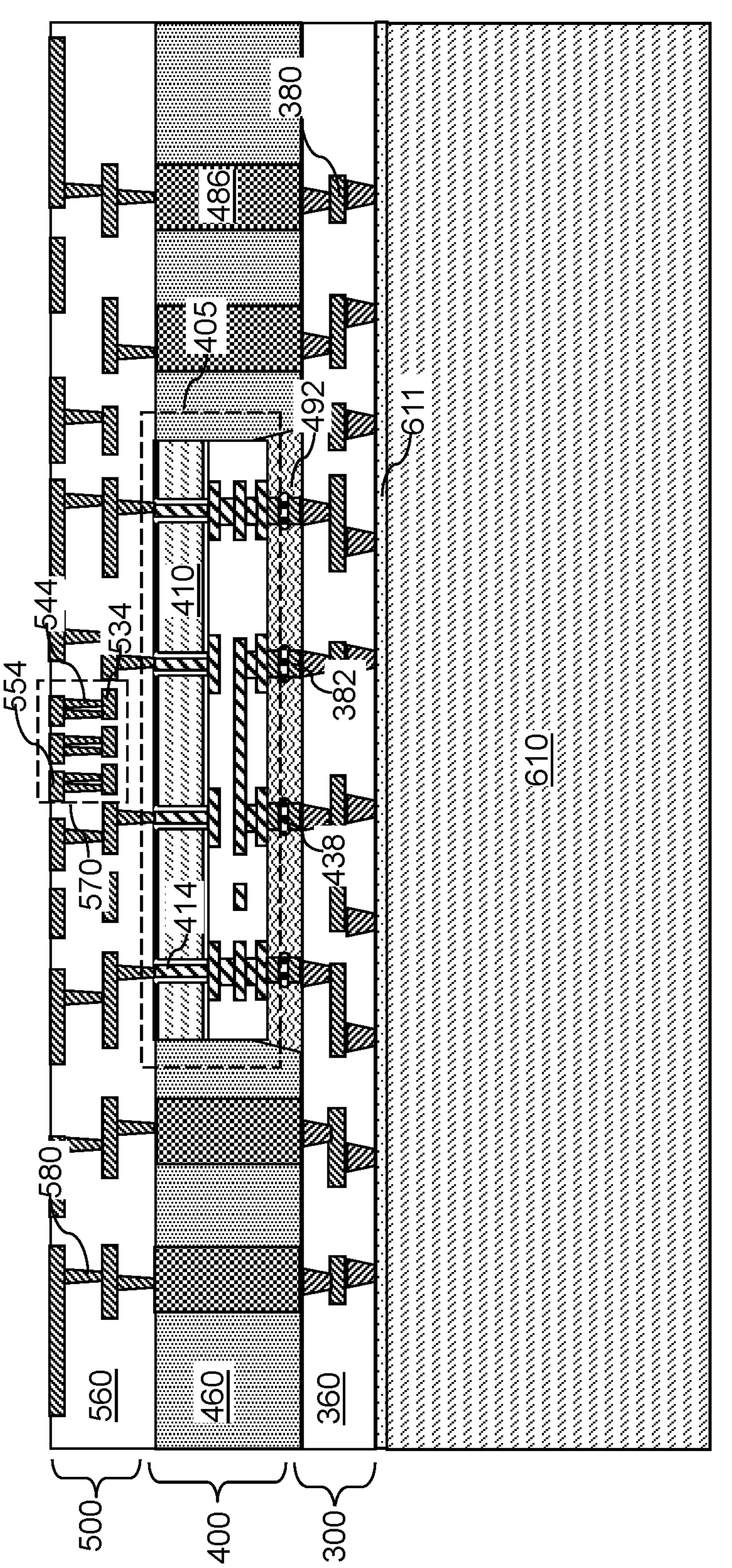
FIG. 5 is vertical cross-sectional view of the intermediate structure during formation of a substrate-side organic interposer according to an embodiment of the present disclosure.

Referring to FIG. 5, substrate-side redistribution dielectric layers 560 and substrate-side redistribution wiring interconnects 580 may be formed over the two-dimensional array of LSI-containing interposers 400. The substrate-side redistribution dielectric layers 560 are also referred to as second redistribution dielectric layers, and the substrate-side redistribution wiring interconnects 580 are also referred to as second redistribution wiring interconnects. The substrate-side redistribution dielectric layer 560 and the substrate-side redistribution wiring interconnects 580 may be formed by performing a sequence of processing steps at least once. The sequence of processing steps includes a dielectric deposition step that deposits a substrate-side redistribution dielectric layer, a patterning step that forms openings through the substrate-side redistribution dielectric layer, a metal deposition step that deposits a metallic material layer (such as a copper layer), and a patterning step that patterns the metallic material layer into a respective subset of the substrate-side redistribution wiring interconnects 580 formed at a respective level. Generally, the type of processing steps used to form the die-side redistribution dielectric layers 360 and the die-side redistribution wiring interconnects 380 may be performed mutatis mutandis to form the substrate-side redistribution dielectric layers 560 and the substrate-side redistribution wiring interconnects 580. An in-process substrate-side organic interposer 500' may be formed within each unit area over a respective vertical stack of a die-side organic interposer 300 and an LSI-containing interposer 400.

In one embodiment, a subset of the substrate-side redistribution wiring interconnects 580 may be formed directly on, and thus, may be in direct contact with, a subset of metallic structures of the LSI bridge 405. In one embodiment, the subset of metallic structures comprises a plurality of through-silicon via (TSV) structures 414 that vertically extends through a silicon substrate 410 of the LSI bridge 405. In one embodiment, a surface of substrate-side redistribution dielectric layers 560 may be in direct contact with the LSI bridge 405.

At least two substrate-side redistribution dielectric layers 560 and at least two levels of substrate-side redistribution wiring interconnects 580 may be formed. According to an aspect of the present disclosure, at least one metallic counter-deformation structure 570 may be formed concurrently with formation of the substrate-side redistribution wiring interconnects 580. The at least one metallic counter-deformation structure 570 may comprise a same set of materials as, and may be formed concurrently with, the substrate-side redistribution wiring interconnects 580.

In one embodiment, one, a plurality, and/or each of the at least one metallic counter-deformation structure 570 may be electrically isolated from the substrate-side redistribution wiring interconnects 580, and may be electrically floating. According to an aspect of the present disclosure, one, a plurality, and/or each, of the at least one metallic counter-deformation structure 570 may comprise: a plurality of metallic via structures 544; a proximal metallic plate 534 that contacts the plurality of metallic via structures 544 and is more proximal to the LSI-containing interposer 400 than the plurality of metallic via structures 544 is to the LSI-containing interposer 400; and a distal metallic plate 554 that contacts the plurality of metallic via structures 544 and is more distal from the LSI-containing interposer 400 than the respective plurality of metallic via structures 544 is to the LSI-containing interposer 400. In some embodiment, the plurality of metallic via structures 544 and the distal metallic plate 554 may be formed by deposition and patterning of a same set of at least one metallic material as a single contiguous structure.

Generally, the at least one metallic counter-deformation structure 570 may be formed in many different configurations provided that the area of the each metallic counter-deformation structure 570 has a partial areal overlap with the area of the LSI bridge 405 in a plan view such as a see-through top-down view. FIGS. 6A-6E are top-down views of various configurations of the exemplary structure of FIG. 5, in which areas of the at least one metallic counter-deformation structure 570 and the area of the LSI bridge 405 are shown in dotted shapes.

Figure 6A:
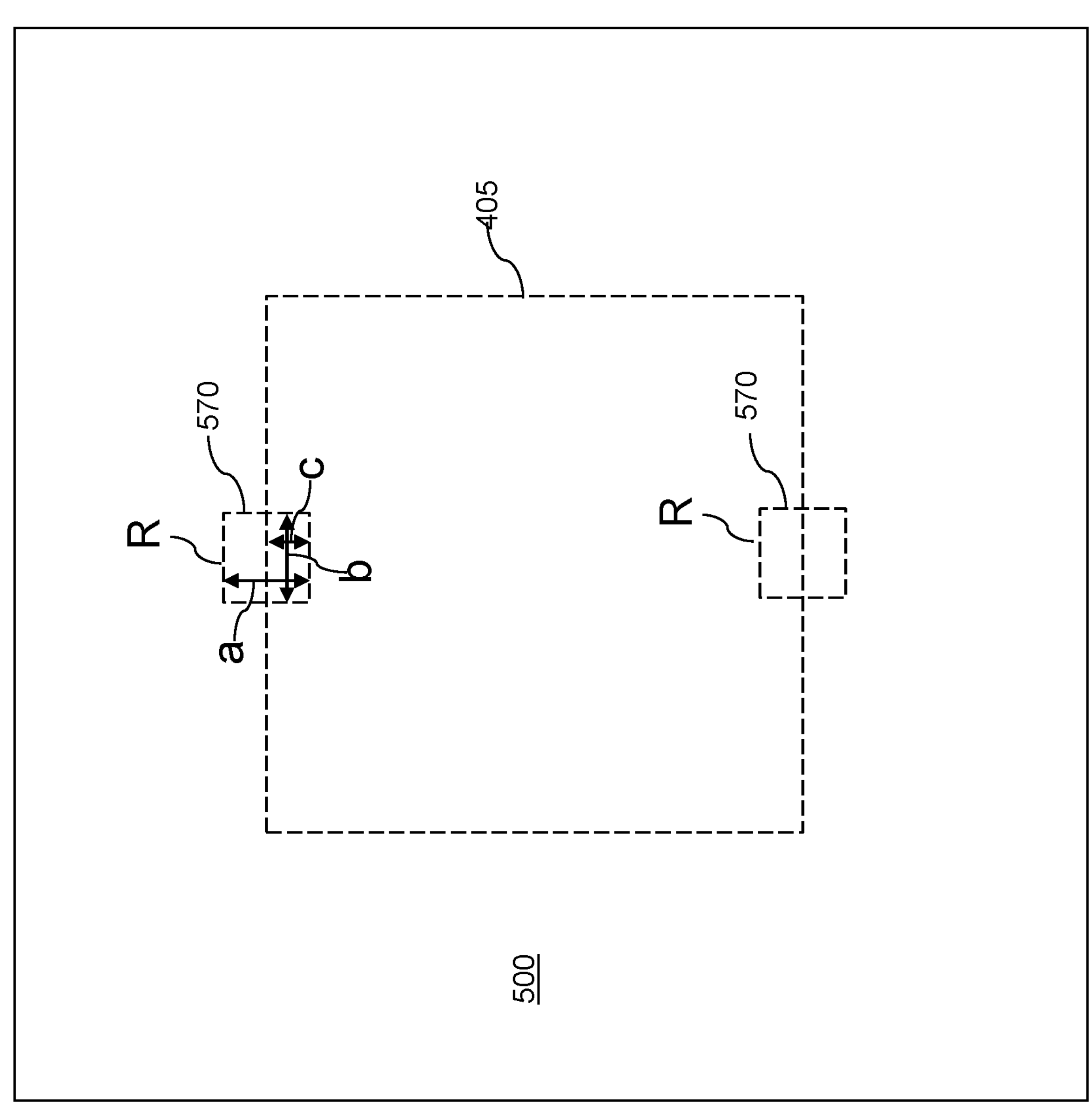
FIGS. 6A-6E are top-down views of various configurations of the intermediate structure of FIG. 5.

FIG. 6A illustrates a first configuration for metallic counter-deformation structures 570, in which two metallic counter-deformation structures 570 have partial areal overlaps with the LSI bridge 405. The two metallic counter-deformation structures 570 may be located around middle portions of a parallel pair of sidewalls of the LSI bridge 405. The length a of each metallic counter-deformation structure 570 along a direction that is perpendicular to the pair of sidewalls may be greater than 300 microns, and/or greater than 600 microns. The width b of each metallic counter-deformation structure 570 along a direction that is parallel to the pair of sidewalls may be greater than 300 microns, and/or greater than 600 microns. The overlap length c of each metallic counter-deformation structure 570 along the direction that is perpendicular to the pair of sidewalls may be greater than 150 microns, and/or greater than 300 microns. The overlap length c is measured between an innermost edge of the metallic counter-deformation structure 570 and a most proximate sidewall of the LSI bridge 405 in the plan view.

Figure 6B:
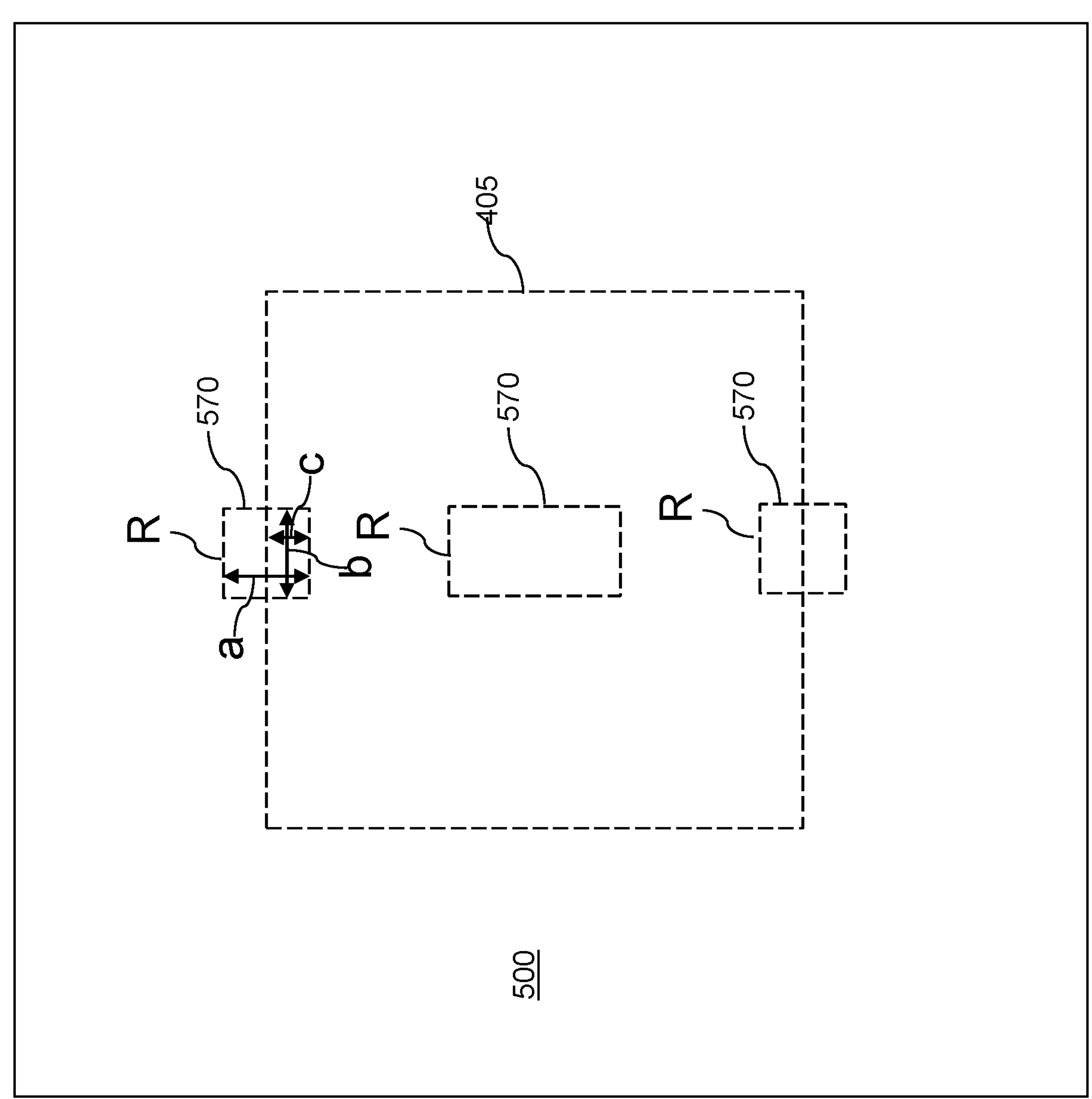

FIG. 6B illustrates a second configuration for metallic counter-deformation structures 570, which may be derived from the first configuration by forming an additional metallic counter-deformation structure 570 that is located in an area of a center portion of the LSI bridge 405. In this embodiment, the additional metallic counter-deformation structure 570 may have a full areal overlap within the LSI bridge 405 in the plan view. The lateral dimensions of the additional metallic counter-deformation structure 570 may be comparable with the lateral dimensions of the two metallic counter-deformation structures 570. Each support region R may include one or more metallic counter-deformation structures 570 therein.

Figure 6C:
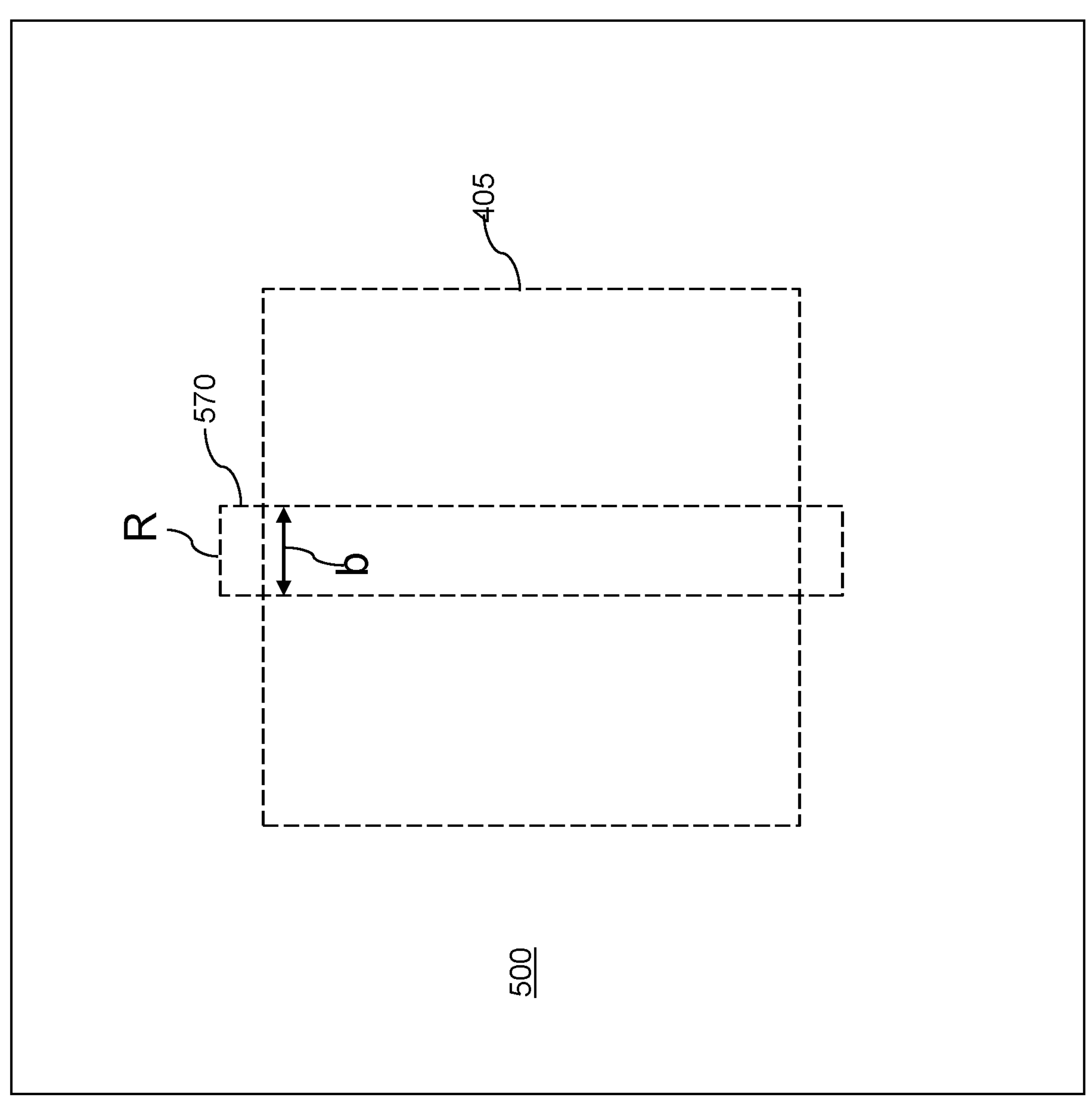

FIG. 6C illustrates a third configuration for metallic counter-deformation structures 570, in which one or more metallic counter-deformation structures 570 may be formed in a strip region having a length that is greater than a maximum lateral dimension of the LSI bridge 405 along a horizontal direction. In the illustrated example, one or more metallic counter-deformation structures 570 may be formed in a strip area having a width b that is greater than 300 microns, and/or greater than 600 microns. Each support region R may include one or more metallic counter-deformation structures 570 therein.

Figure 6D:
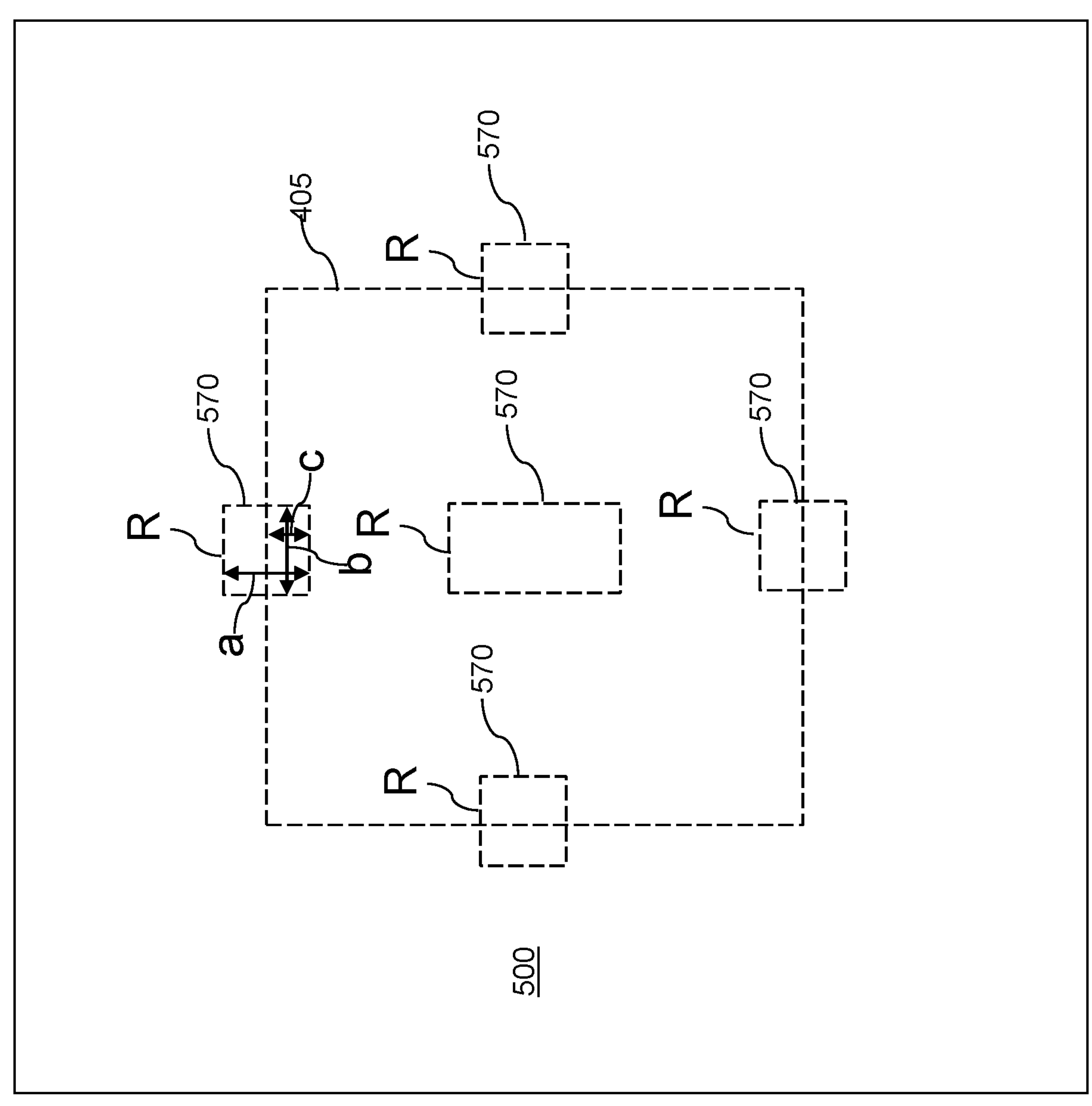

FIG. 6D illustrates a fourth configuration for metallic counter-deformation structures 570, which may be derived from the second configuration by forming yet additional metallic counter-deformation structures in areas A that have overlaps with middle portions of another parallel pair of sidewalls of the LSI bridge 405. Each support region R may include one or more metallic counter-deformation structures 570 therein.

Figure 6E:
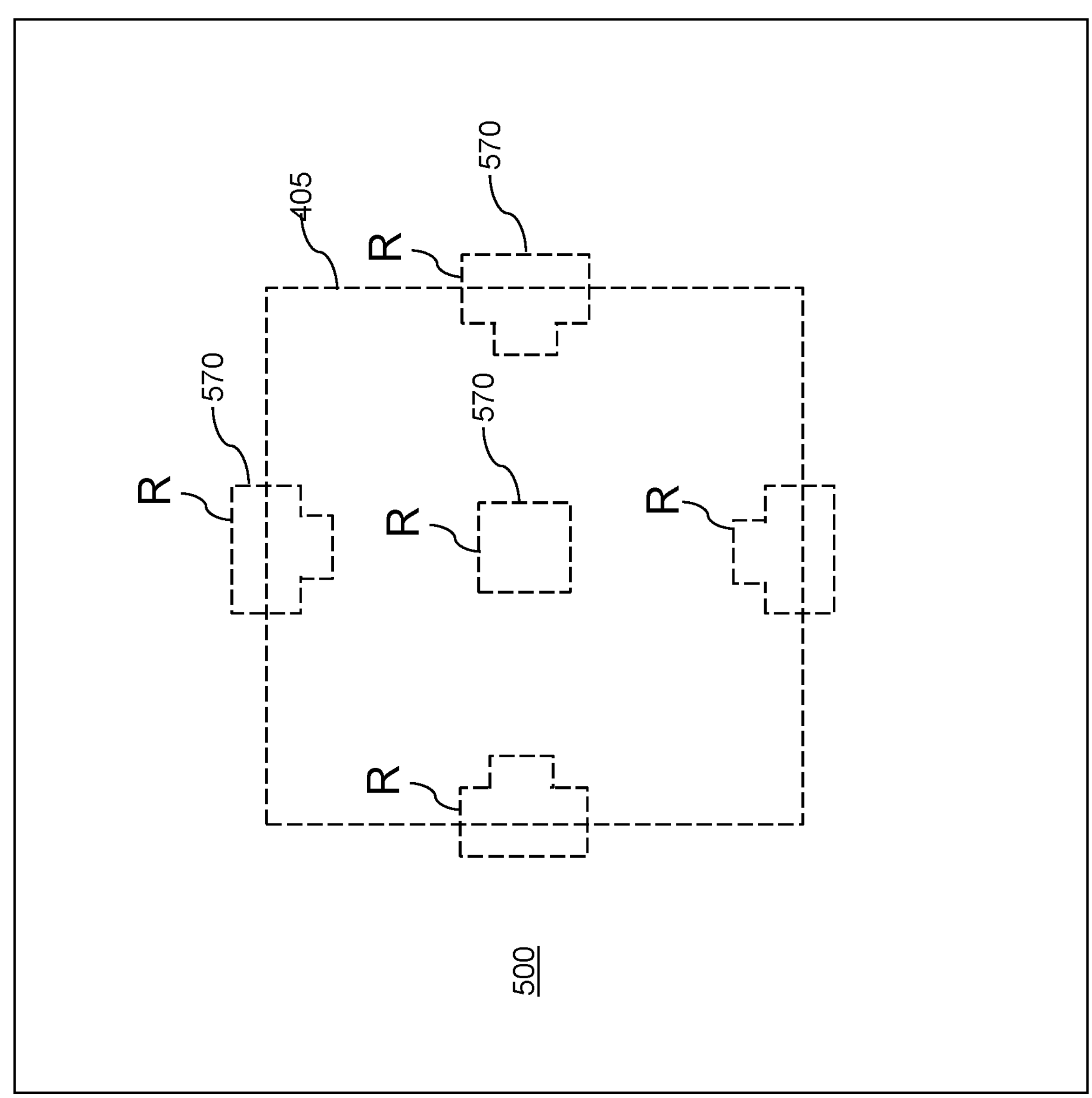

FIG. 6E illustrates a fifth configuration for metallic counter-deformation structures 570, which may be derived from any of the first, second, third, and fourth configurations by modifying at least one support region R such that one or more of the areas A at least one support region R have an irregular horizontal cross-sectional shape in the plan view.

The overlap width c of each metallic counter-deformation structure 570 along the direction that is perpendicular to the pair of sidewalls may be greater than 150 microns, and/or greater than 300 microns. The overlap width c is measured between an innermost edge of the metallic counter-deformation structure 570 and a most proximate sidewall of the LSI bridge 405 in the plan view.

Generally, one, a plurality, and/or each, of the at least one metallic counter-deformation structure 570 comprises: a first portion having an areal overlap with the LSI bridge 405 in a plan view along a vertical direction that is perpendicular to an interface between the LSI-containing interposer 400 and the in-process substrate-side organic interposer 500'; and a second portion that does not have any areal overlap with the LSI bridge 405 in the plan view.

FIGS. 7A-7I are various plan views of metallic counter-deformation structures 570 that may be used in the exemplary structure of FIGS. 5 and 6A-6E. According to an aspect of the present disclosure, direct overlap of the shape of the distal metallic plate 554 and the shape of the proximal metallic plate 534 may be avoided. In one embodiment, a periphery of the distal metallic plate 554 may be laterally offset from a periphery of the proximal metallic plate 534 in a plan view along a vertical direction that is perpendicular to an interface between the LSI-containing interposer 400 and the second organic interposer 500. In this embodiment, the plurality of metallic via structures 544 is located entirely within an area of an overlap between the distal metallic plate 554 and the proximal metallic plate 534 in the plan view.

In one embodiment, the shape of the at least one distal metallic plate 554 of each metallic counter-deformation structure 570 in the plan view may be congruent with the shape of the at least one proximal metallic plate 534 of the same metallic counter-deformation structure 570 in the plan view, the at least one distal metallic plate 554 in the plan view may be laterally offset from the at least one proximal metallic plate 534 by at least 20 microns, and/or by at least 40 microns, to reduce line-up of the distal metallic plate 554 to the proximal metallic plate 534 in the plan view. By reducing the line-up of the distal metallic plate 554 and the proximal metallic plate 534 in each metallic counter-deformation structure 570, mechanical stress that is transmitted along a vertical direction may be more effectively spread along horizontal directions.

Within each support region R in which a metallic counter-deformation structure 570 is provided, the coverage of the support region R by the at least one distal metallic plate 554 may be greater than 80%, and/or may be greater than 90%. Within each support region R in which a metallic counter-deformation structure 570 is provided, the coverage of the support region R by the at least one proximal metallic plate 534 may be greater than 80%, and/or may be greater than 90%. As used herein, a coverage of a region by an element refers to the ratio of the area of the element to the entire area of the region. In one embodiment, the total areas of the metallic via structures 544 in a support region R in a plan view may be greater than 70% of the overlap area between the at least one distal metallic plate 554 and at least one proximal metallic plate 534 in the support region R. In one embodiment, within each support region R in which a metallic counter-deformation structure 570 is provided, the coverage of the support region R by the metallic via structures 544 may be greater than 70%, and/or may be greater than 80%.

Figure 7A:
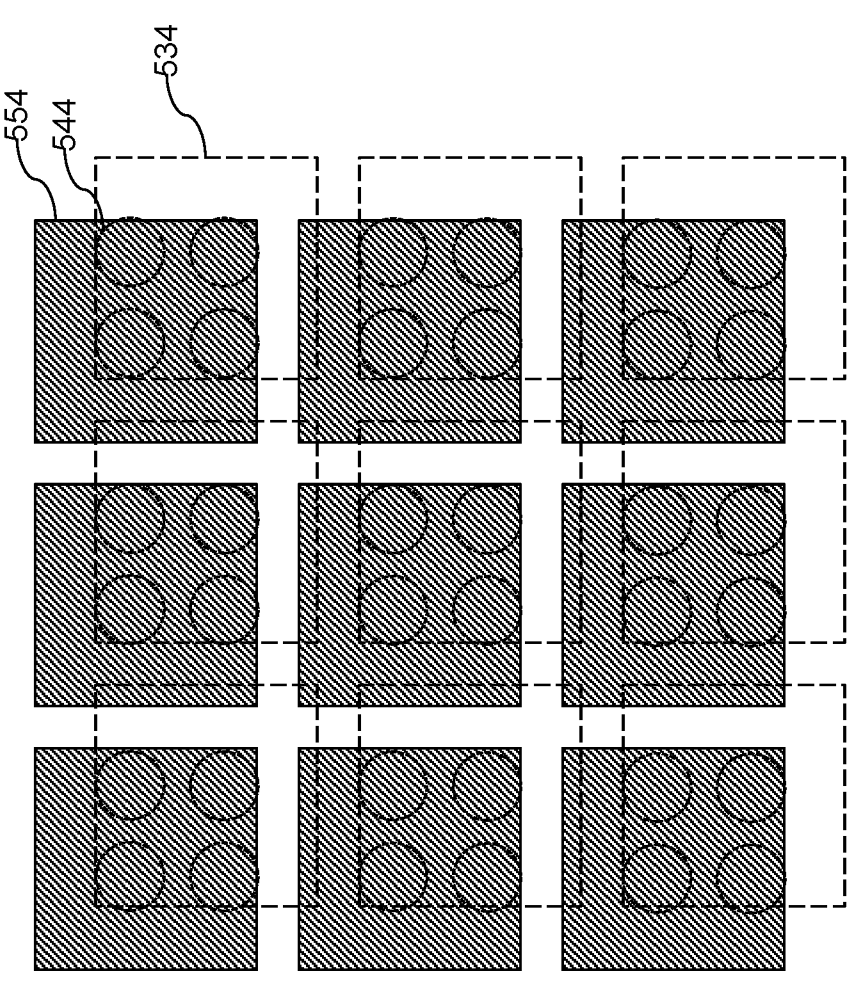

Referring to FIG. 7A, a first configuration of the metallic counter-deformation structure 570 is illustrated, in which a plurality of metallic via structures 544 is attached to a two-dimensional array of distal metallic plates 554 and to a two-dimensional array of proximal metallic plates 534. The plurality of metallic via structures 544 may comprise a plurality of clusters of metallic via structures 544. Each cluster of metallic via structures 544 may be attached to a respective one of the distal metallic plates 554 and to a respective one of the proximal metallic plates 534. The two-dimensional array of distal metallic plates 554 may be a rectangular array, and the two-dimensional array of proximal metallic plates 534 may be another rectangular array having the same two-dimensional periodicity as the rectangular array of the distal metallic plates 554. As discussed above, the array of the distal metallic plates 554 in the plan view may be laterally offset from the array of the proximal metallic plates 534 by at least 20 microns, and/or by at least 40 microns.

Figure 7B:
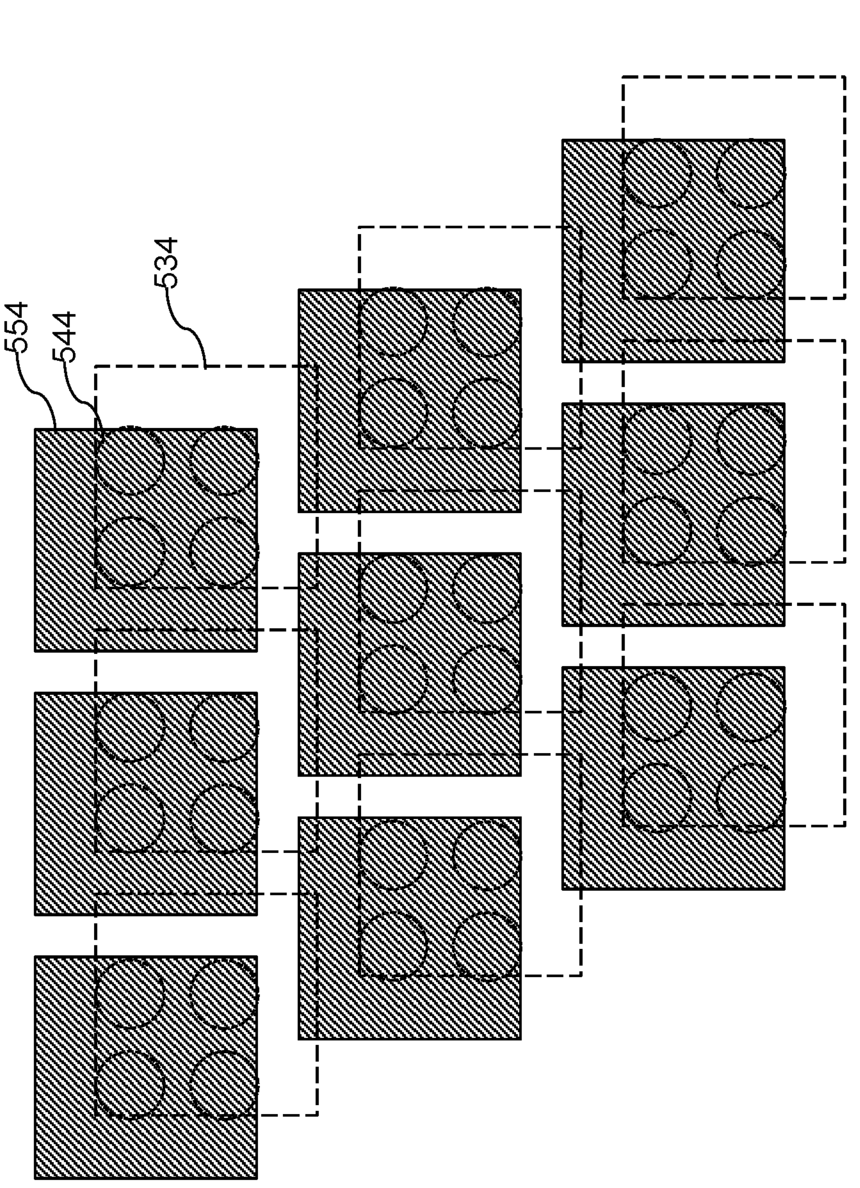

Referring to FIG. 7B, a second configuration of the metallic counter-deformation structure 570 is illustrated, which may be derived from the first configuration illustrated in FIG. 7B by changing a direction of periodicity for the two-dimensional array of distal metallic plates 554 and for the two-dimensional array of proximal metallic plates 534. In this embodiment, two directions of periodicity may be non-orthogonal. The array of the distal metallic plates 554 in the plan view may be laterally offset from the array of the proximal metallic plates 534 by at least 20 microns, and/or by at least 40 microns.

Referring to FIG. 7C, a third configuration of the counter-deformation structure 570 is illustrated. The metallic counter-deformation structure 570 comprises a plurality of metallic via structures 544 attached to a distal metallic plate 554 and to a proximal metallic plate 534. The distal metallic plates 554 in the plan view may be laterally offset from the proximal metallic plate 534 by at least 20 microns, and/or by at least 40 microns.

Referring to FIG. 7D, a fourth configuration of the counter-deformation structure 570 is illustrated, which may be derived from the third configuration by forming discrete holes through the distal metallic plate 554 and through the proximal metallic plate 534. The areas of the holes may, or may not, overlap in the plan view.

Figure 7E:
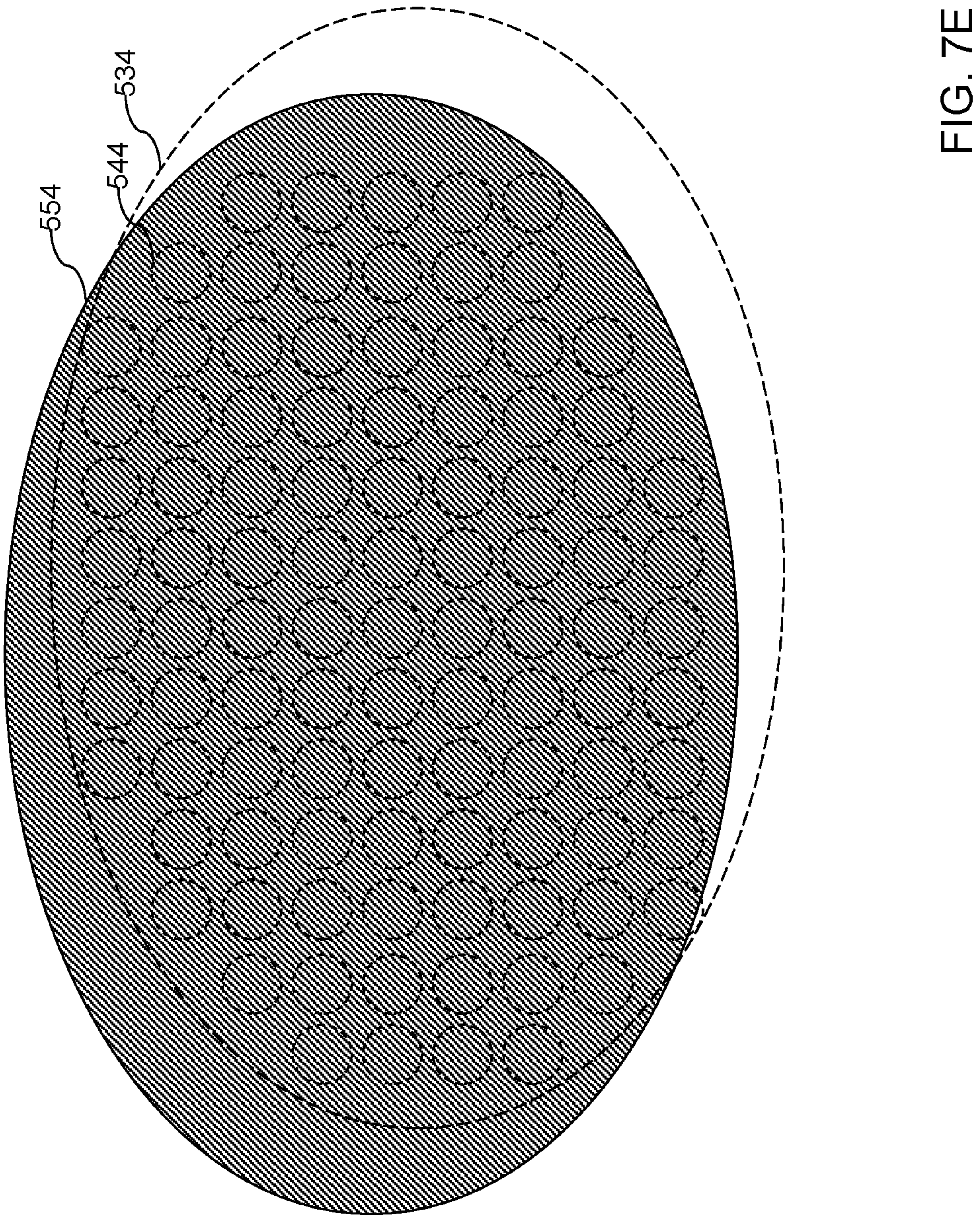

Referring to FIG. 7E, a fifth configuration of the counter-deformation structure 570 is illustrated, which may be derived from the third configuration by using a distal metallic plate 554 and a proximal metallic plate 534 having a same horizontal cross-sectional shape of an oval, and laterally offset from each other by a lateral offset distance that is at least 20 microns, and/or at least 40 microns.

Figure 7F:
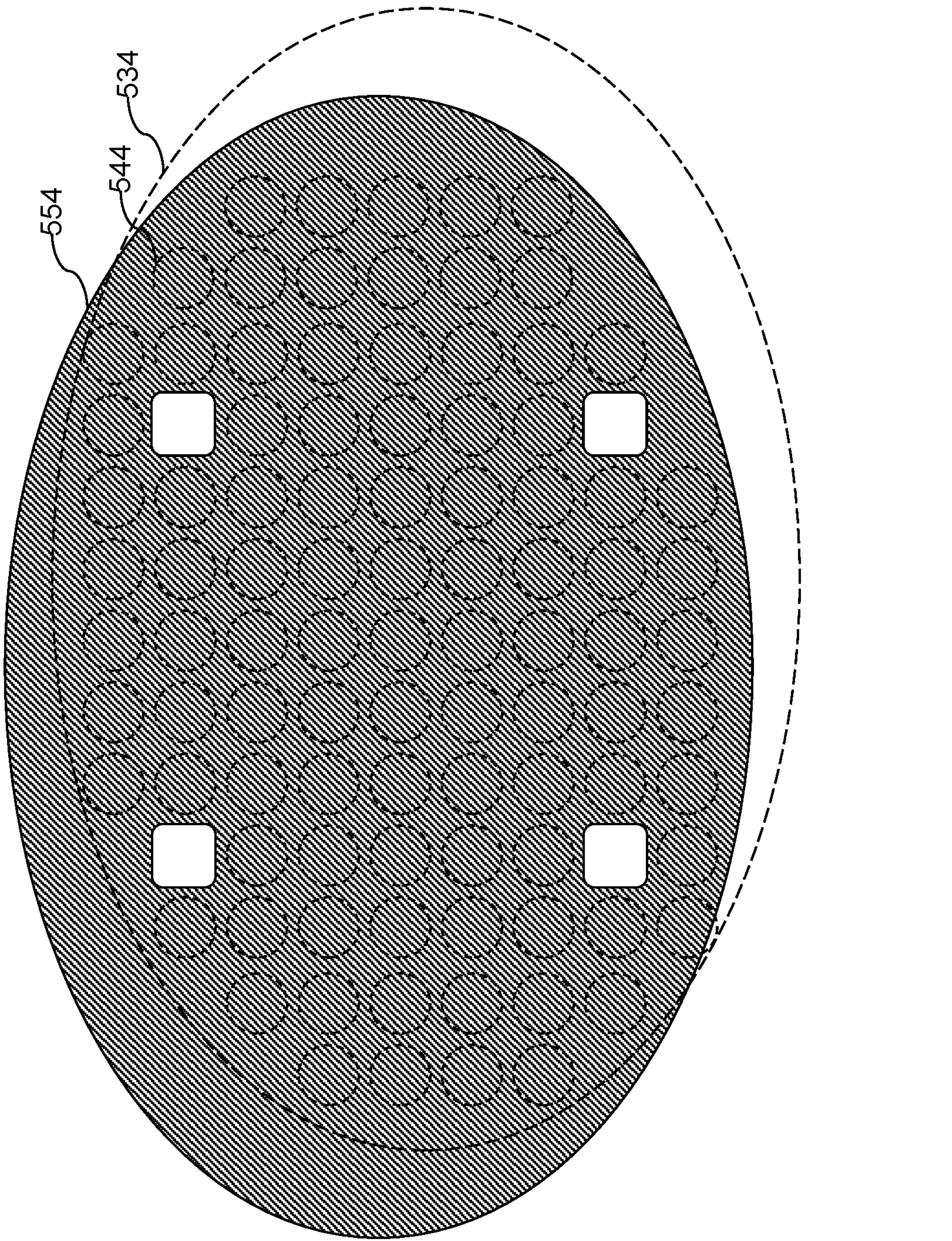

Referring to FIG. 7F, a sixth configuration of the counter-deformation structure 570 is illustrated, which may be derived from the fifth configuration by forming discrete holes through the distal metallic plate 554 and through the proximal metallic plate 534. The areas of the holes may, or may not, overlap in the plan view.

Figure 7G:
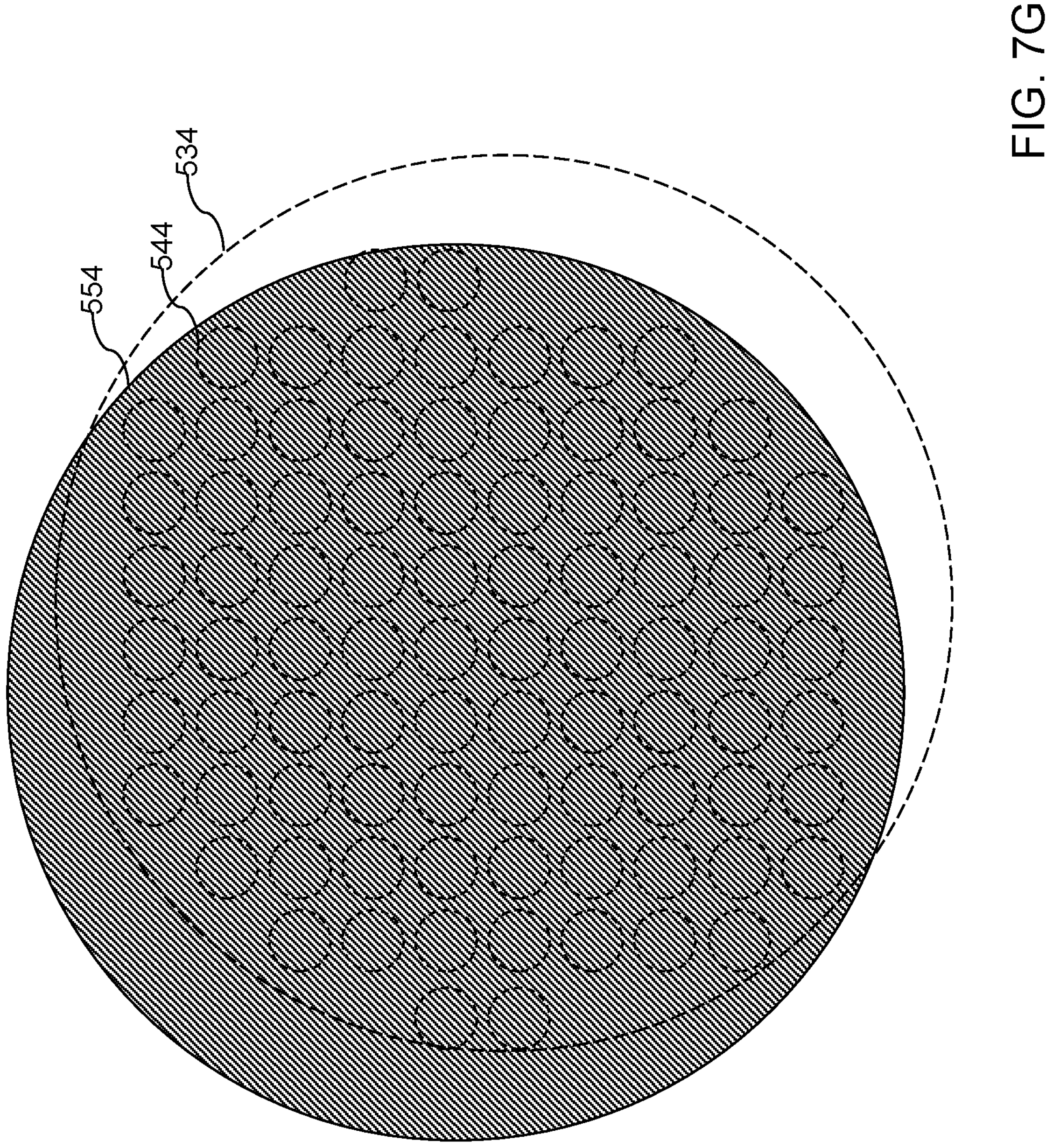

Referring to FIG. 7G, a seventh configuration of the counter-deformation structure 570 is illustrated, which may be derived from the fifth configuration by using a distal metallic plate 554 and a proximal metallic plate 534 having a same horizontal cross-sectional shape of a circle, and laterally offset from each other by a lateral offset distance that is at least 20 microns, and/or at least 40 microns.

Figure 7H:
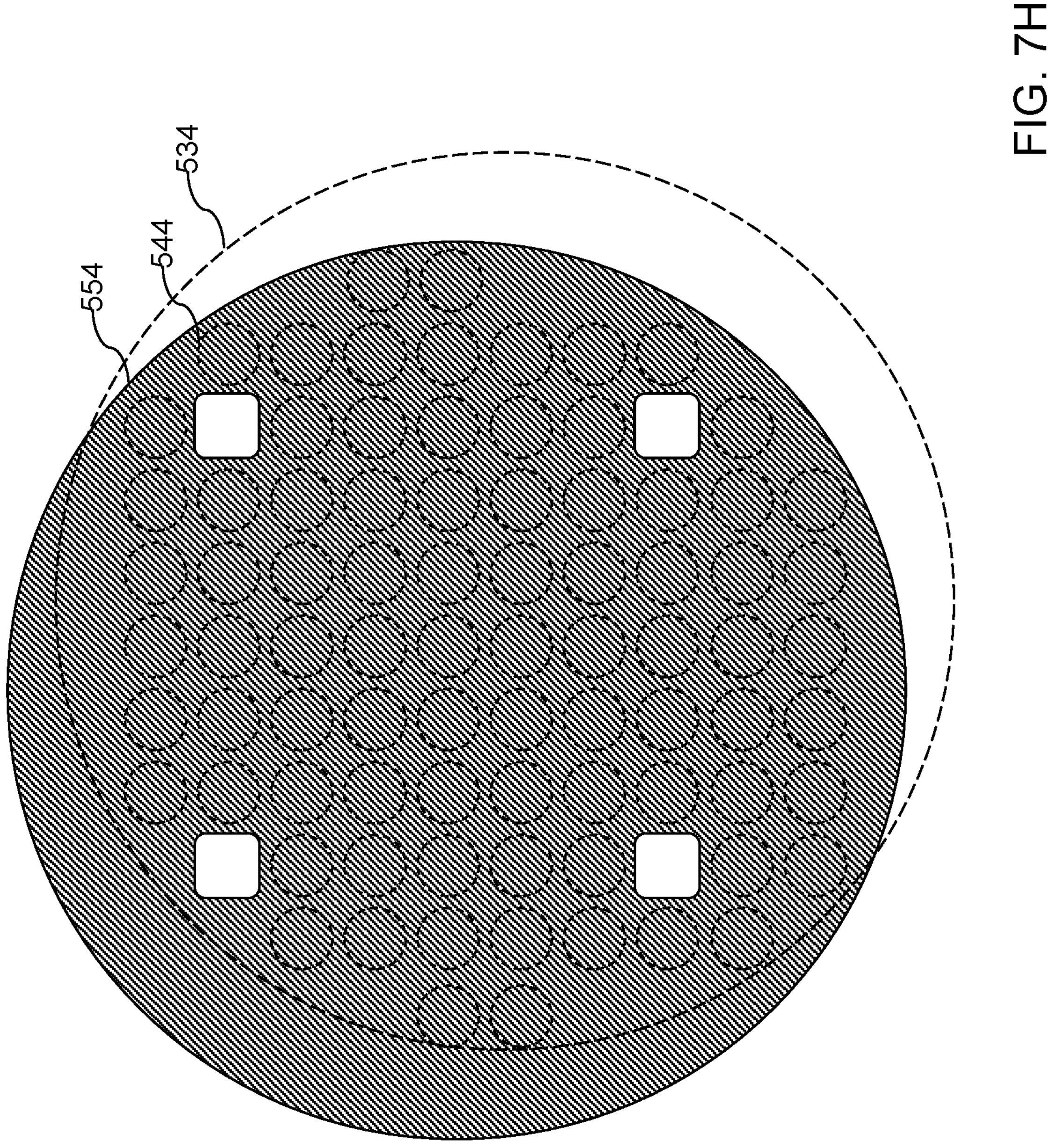

Referring to FIG. 7H, an eighth configuration of the counter-deformation structure 570 is illustrated, which may be derived from the seventh configuration by forming discrete holes through the distal metallic plate 554 and through the proximal metallic plate 534. The areas of the holes may, or may not, overlap in the plan view.

Figure 7I:
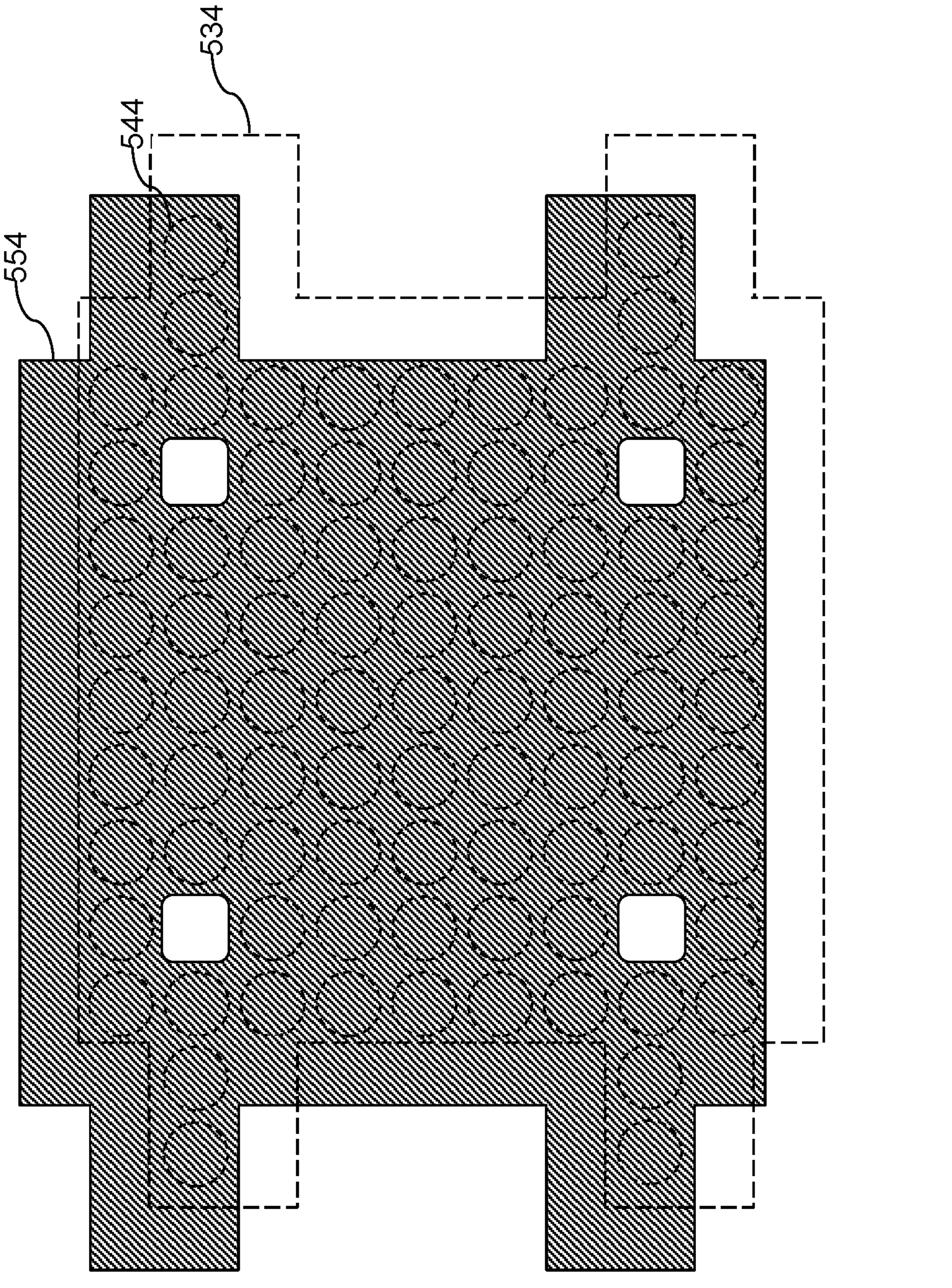

Referring to FIG. 7I, a ninth configuration of the counter-deformation structure 570 is illustrated, which may be derived from any of the third through eighth configurations by using an irregular shape for each of the distal metallic plate 554 and the proximal metallic plate 534. The distal metallic plate 554 and the proximal metallic plate 534 may have a same horizontal cross-sectional shape, and may be laterally offset from each other by a lateral offset distance that is at least 20 microns, and/or at least 40 microns. In one embodiment, holes may be optionally formed through the distal metallic plate 554 and through the proximal metallic plate 534. The areas of the holes may, or may not, overlap in the plan view.

Figure 8:
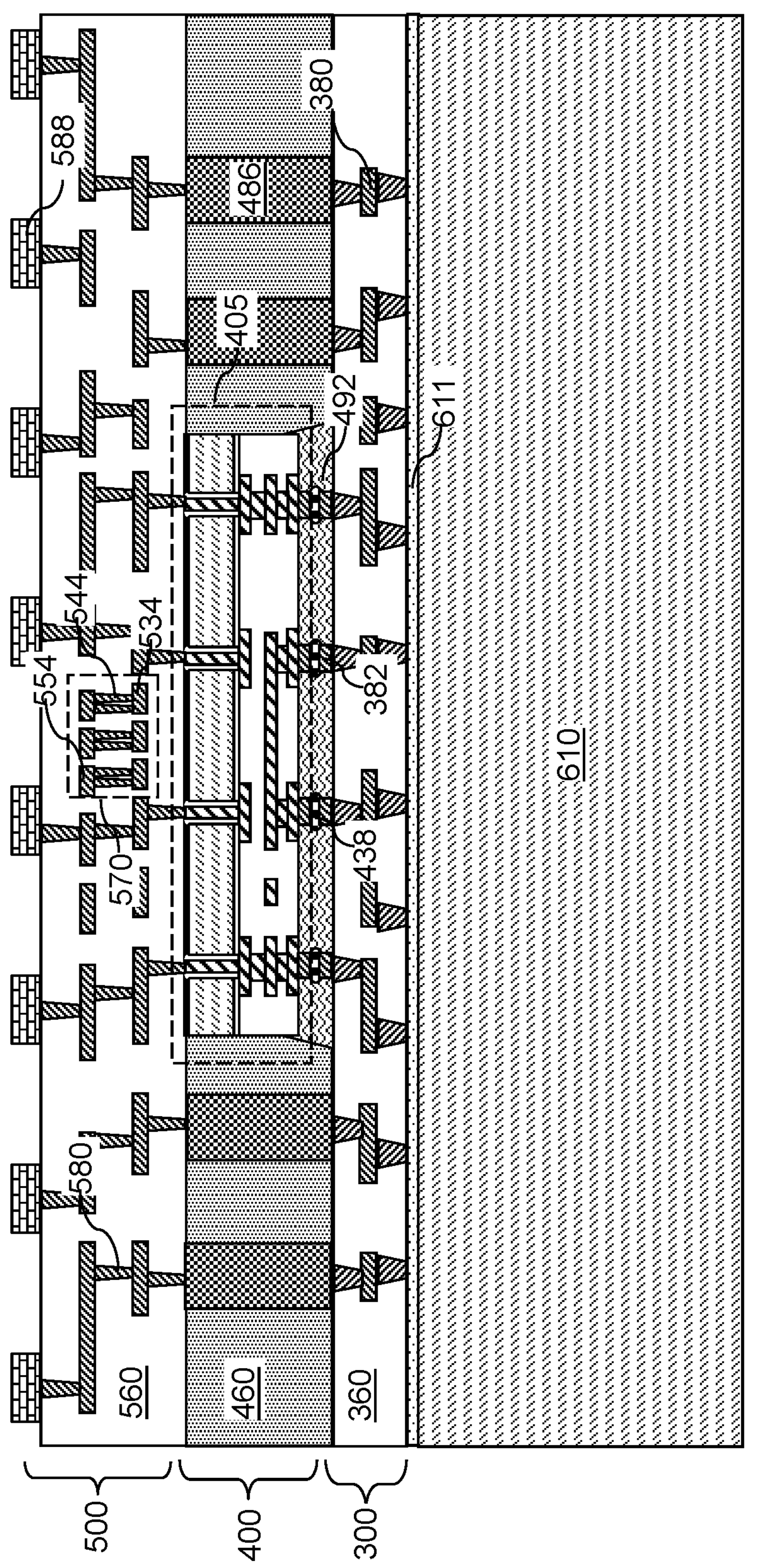
FIG. 8 is vertical cross-sectional view of the intermediate structure after formation of the substrate-side organic interposer according to an embodiment of the present disclosure.

Referring to FIG. 8, at least one additional substrate-side redistribution dielectric layer 560 and at least one additional level of substrate-side redistribution wiring interconnects 580 may be optionally formed. Interposer-side bonding pads 588 may be formed at the topmost level of the substrate-side redistribution dielectric layers 560. In one embodiment, the interposer bonding pads 588 may be formed as a two-dimensional array of interposer bonding pads 588, which may be a periodic array such as a rectangular array or a hexagonal array. Generally, the pitches of the two-dimensional array of interposer bonding pads 588 along horizontal directions may be in a range from 100 microns to 800 microns, although lesser and greater pitches may also be used. For example, the pitches of the two-dimensional array of interposer bonding pads 588 may be in a range from 200 microns to 700 microns, although lesser and greater pitches may also be used. A substrate-side organic interposer 500 may be formed within each unit area of the reconstituted wafer. Each vertical stack of a die-side organic interposer 300, an LSI-containing interposer 400, and a substrate-side organic interposer 500 in each unit area constitutes a composite interposer (300, 400, 500).

In one embodiment, each composite interposer (300, 400, 500) comprises: a local-silicon-interconnect-containing (LSI-containing) interposer 400 that includes a local silicon interconnect (LSI) bridge 405; and an organic interposer (such as a substrate-side organic interposer 500) located on the LSI-containing interposer 400, comprising redistribution dielectric layers (such as substrate-side redistribution dielectric layers 560) embedding redistribution wiring interconnects (such as substrate-side redistribution wiring interconnects 580) and a metallic counter-deformation structure 570. The metallic counter-deformation structure 570 comprises: a plurality of metallic via structures 544; a first metallic plate 534 located on a first side of the plurality of metallic via structures 544; and a second metallic plate 554 located on a second side of the plurality metallic via structures 544 and vertically spaced from the first metallic plate 534.

In one embodiment, each composite interposer (300, 400, 500) comprises: a local-silicon-interconnect-containing (LSI-containing) interposer 400 that comprises a local silicon interconnect (LSI) bridge 405, a set of through-integrated-fan-out-via (TIV) structures 486 laterally surrounding the LSI bridge 405, and a molding compound interposer frame 460 that laterally surrounds the LSI bridge 405 and the TIV structures 486; and an organic interposer (such as a substrate-side organic interposer 500) located on the LSI-containing interposer 400 and comprising redistribution dielectric layers (such as substrate-side redistribution dielectric layers 560) embedding redistribution wiring interconnects (such as substrate-side redistribution wiring interconnects 580) and metallic counter-deformation structures 570 that are electrically floating. Each of the metallic counter-deformation structures 570 comprises: a respective plurality of metallic via structures 544; a respective proximal metallic plate 534 that contacts the respective plurality of metallic via structures 544 and is more proximal to the LSI-containing interposer 400 than the respective plurality of metallic via structures 544 is to the LSI-containing interposer 400; and a respective distal metallic plate 554 that contacts the respective plurality of metallic via structures 544 and is more distal from the LSI-containing interposer 400 than the respective plurality of metallic via structures 544 is to the LSI-containing interposer 400.

In one embodiment, at least one metallic counter-deformation structure 570 selected from the metallic counter-deformation structures 570 comprises: a first portion having an areal overlap with the LSI bridge 405 in a plan view along a direction that is perpendicular to an interface between the LSI-containing interposer 400 and the organic interposer (such as a substrate-side organic interposer 500); and a second portion that does not have any areal overlap within the LSI bridge 405 in the plan view. In one embodiment, the LSI bridge 405 comprises two pairs of sidewalls; and the metallic counter-deformation structures 570 have an areal overlap within at least two sidewalls selected from the two pairs of sidewalls in a plan view along a direction that is perpendicular to an interface between the LSI-containing interposer 400 and the organic interposer (such as a substrate-side organic interposer 500).

In one embodiment, each of the metallic counter-deformation structure 570 may be electrically floating, and may be electrically isolated from each of the substrate-side redistribution wiring interconnects 580. In one embodiment, the first metallic plate 534 comprises at least one first opening therein; the second metallic plate 554 comprises at least one second opening therein; and the at least one second opening has an areal overlap with the at least one first opening in a plan view along a direction that is perpendicular to an interface with the LSI-containing interposer 400 and the substrate-side organic interposer 500.

Figure 9:
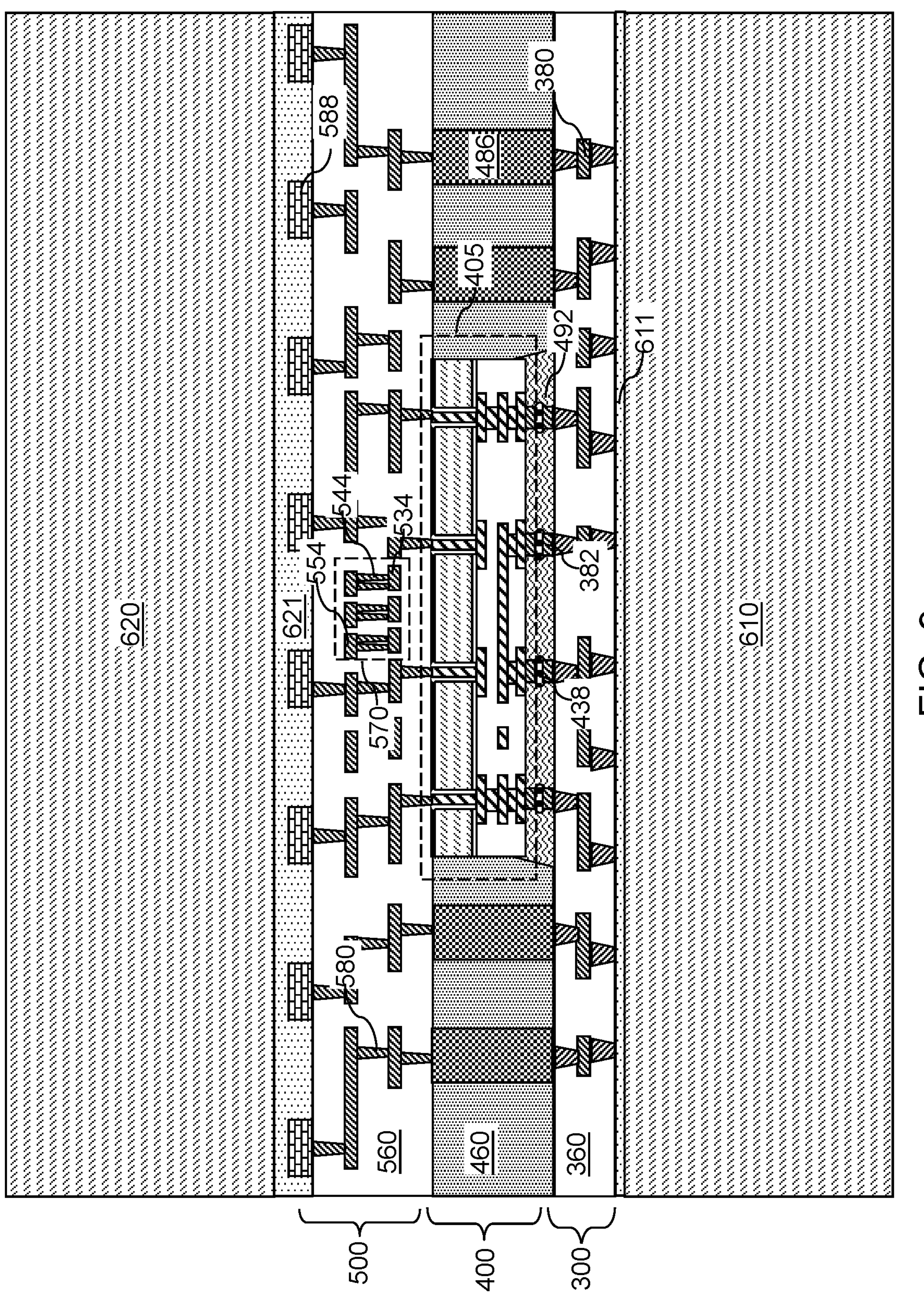
FIG. 9 is a vertical cross-sectional view of the intermediate structure after attaching of a second carrier wafer to a composite interposer according to an embodiment of the present disclosure.

Referring to FIG. 9, a second adhesive layer 621 may be applied over the substrate-side organic interposers 500. The second adhesive layer 621 may comprise a light-to-heat conversion (LTHC) layer or a thermally decomposing adhesive material layer depending on the removal mechanism to be subsequently used. A second carrier wafer 620 may be attached to the substrate-side organic interposers 500 through the second adhesive layer 621. The second carrier wafer 620 may comprise any material that may be used for the first carrier wafer 610, and generally may have about the same thickness range as the first carrier wafer 610.

Figure 10:
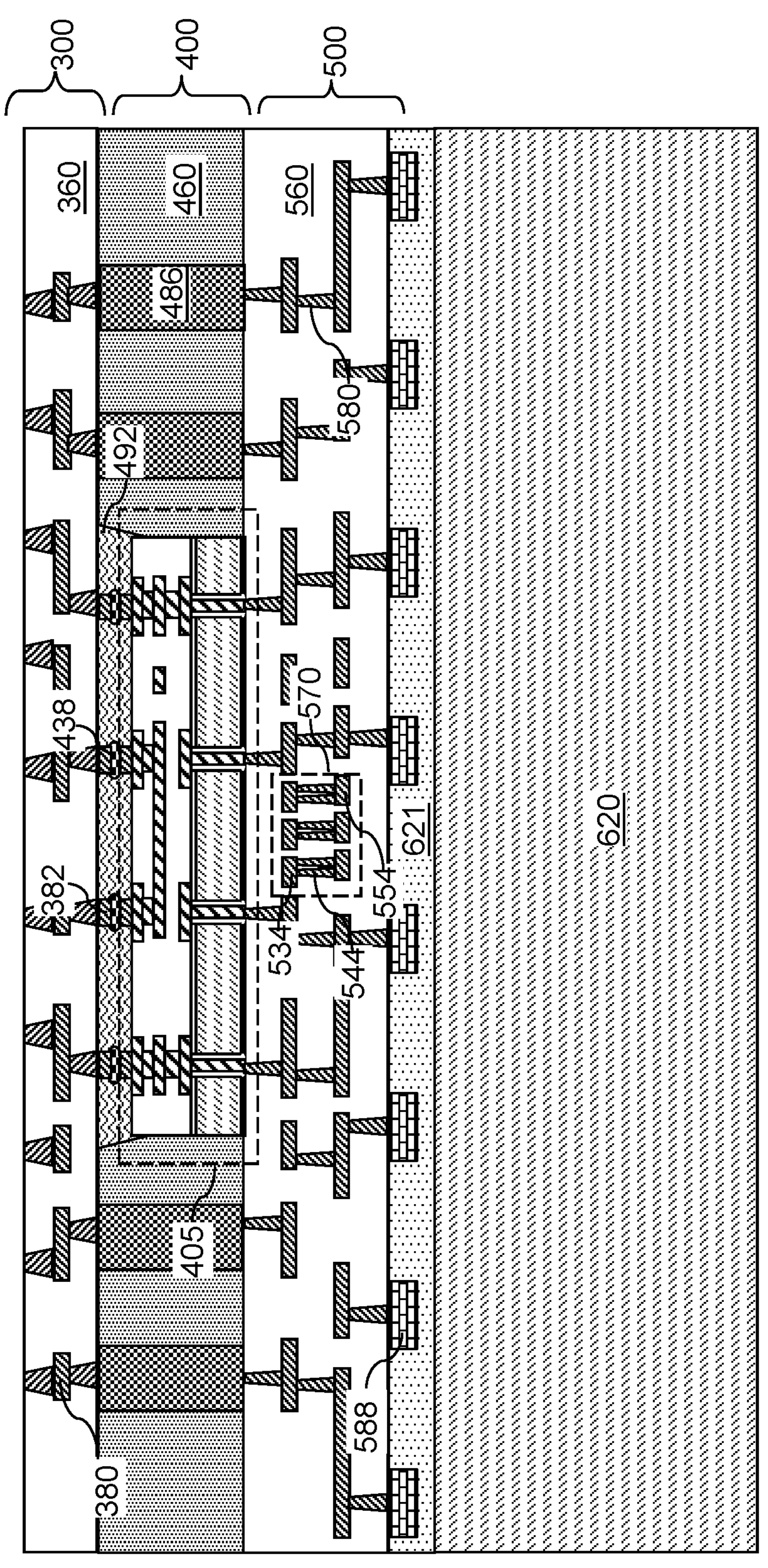
FIG. 10 is a vertical cross-sectional view of the intermediate structure after detaching the first carrier wafer according to an embodiment of the present disclosure.

Referring to FIG. 10, the first carrier wafer 610 may be detached from the reconstituted wafer. In some embodiments, the first carrier wafer 610 may be removed by backside grinding. In embodiments in which the first carrier wafer 610 includes an optically transparent material and the first adhesive layer 611 comprises a light-to-heat conversion material, irradiation through the first carrier wafer 610 may be used to detach the first carrier wafer 610. In embodiments in which the first adhesive layer 611 comprises a thermally decomposable adhesive material, an anneal process or a laser irradiation may be used to detach the first carrier wafer 610. A suitable clean process may be performed to remove residual portions of the first adhesive layer 611.

Figure 11:
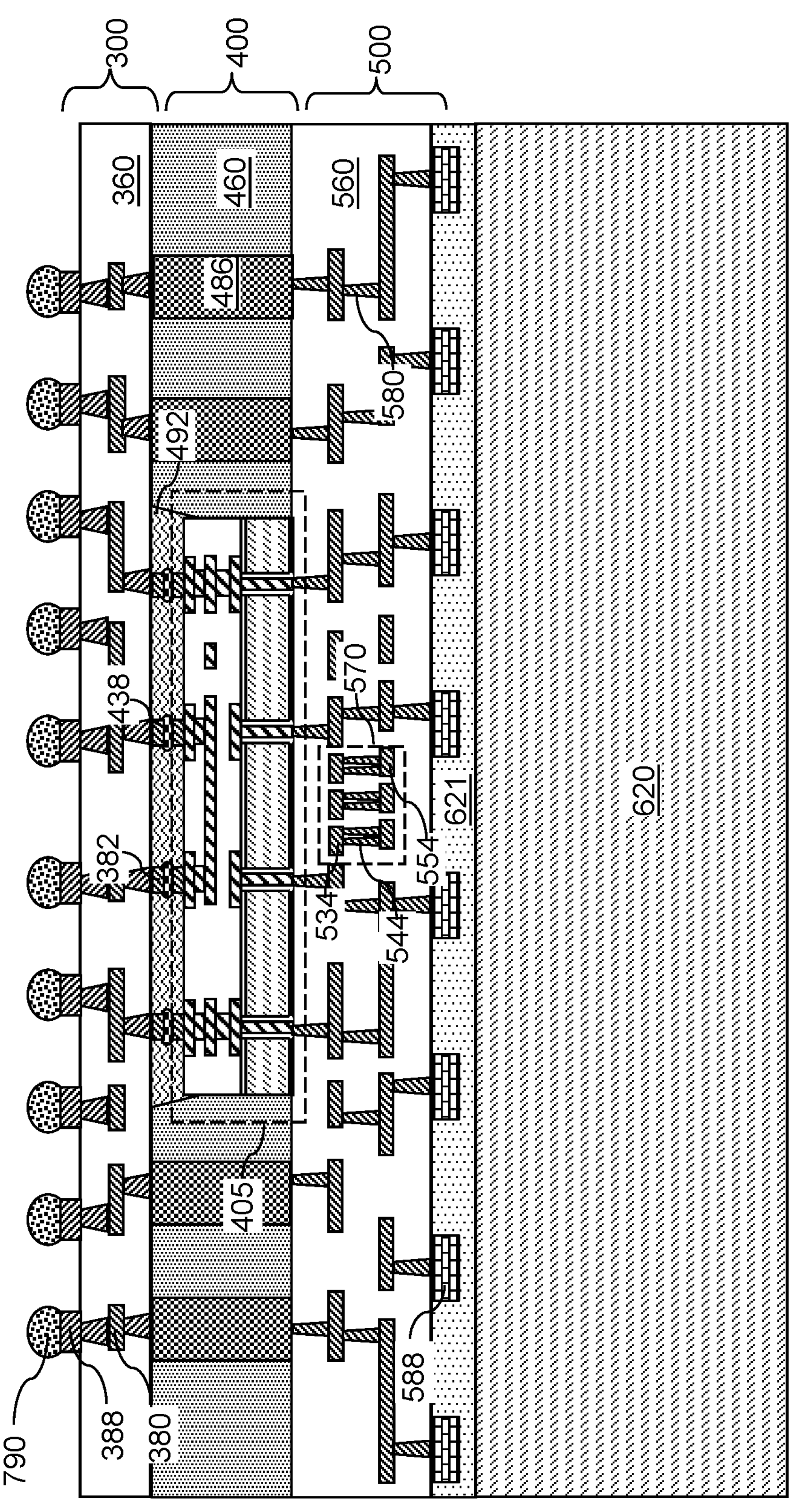
FIG. 11 is a vertical cross-sectional view of the intermediate structure after formation of on-interposer bump structures to the composite interposer according to an embodiment of the present disclosure.

Referring to FIG. 11, on-interposer bump structures 388 may be formed on the top surface of the composite interposers (300, 400, 500). The on-interposer bump structures 388 are bump structures that are subsequently used to attach semiconductor dies. The metallic material of the on-interposer bump structures 388 may include copper. Other metallic materials are within the contemplated scope of disclosure. The on-interposer bump structures 388 may have horizontal cross-sectional shapes of rectangles, rounded rectangles, or circles. Other horizontal cross-sectional shapes may be within the contemplated scope of disclosure. Typically, the on-interposer bump structures 388 may be configured for microbump bonding, and may have a thickness in a range from 10 microns to 100 microns, although lesser or greater thicknesses may also be used. In such an embodiment, the on-interposer bump structures 388 may be formed as an array of microbumps (such as copper pillars) having a lateral dimension in a range from 10 microns to 50 microns, and having a pitch in a range from 20 microns to 100 microns. Generally, the pitches of the on-interposer bump structures 388 may be smaller than the pitches of the two-dimensional array of interposer-side bonding pads 588 by a factor in a range from 1 to 40, such as from 2 to 20.

Solder material portions may be applied to the on-interposer bump structures 388. The solder material portions are herein referred to as die-interposer-bonding (DIB) solder material portions 790, or as first solder material portions. In one embodiment, the DIB solder material portions 790 may comprise microbumps.

Figure 12:
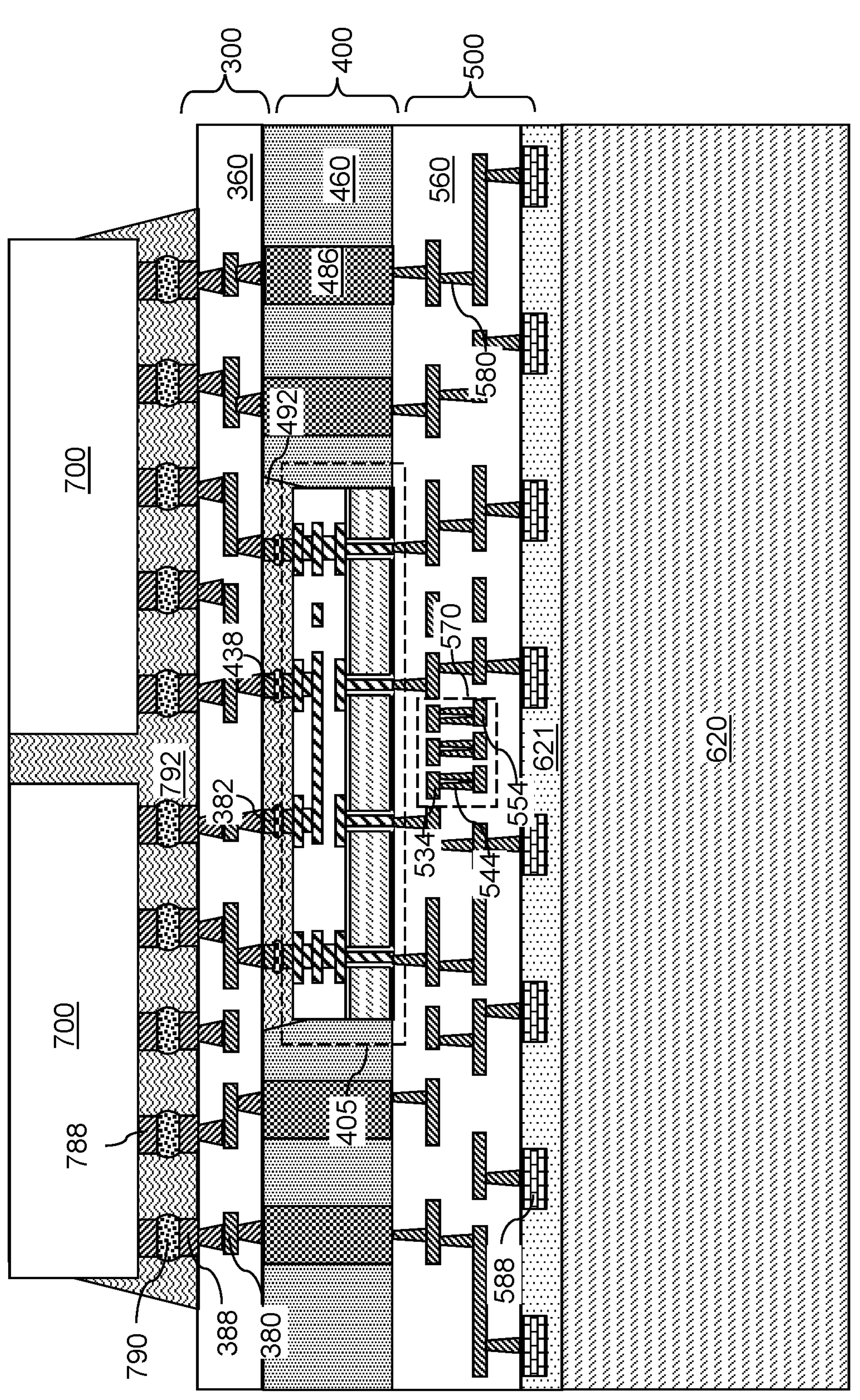
FIG. 12 is a vertical cross-sectional view of the intermediate structure after attaching semiconductor dies to the composite interposer according to an embodiment of the present disclosure.

Referring to FIG. 12, a set of at least one semiconductor die 700 may be bonded to each composite interposer (300, 400, 500). In one embodiment, the composite interposers (300, 400, 500) may be arranged as a two-dimensional periodic array within the reconstituted wafer in the exemplary structure, and multiple sets of at least one semiconductor die 700 may be bonded to the composite interposers (300, 400, 500) as a two-dimensional periodic rectangular array of sets of at least one semiconductor die 700. Each set of at least one semiconductor die 700 may include any set of semiconductor dies known in the art. In one embodiment, each set of at least one semiconductor die 700 may include at least one system-on-chip (SoC) die and/or at least one memory die. Optionally, each set of at least one semiconductor die 700 may include at least one surface mount die known in the art. Each SoC die may comprise an application processor die, a central processing unit die, or a graphic processing unit die. In one embodiment, the at least one memory die may comprise a high bandwidth memory (HBM) die that includes a vertical stack of static random access memory dies. In one embodiment, the at least one semiconductor die 700 may include at least one system-on-chip (SoC) die and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die 700 may comprise a respective array of on-die bump structures 788. Each of the at least one semiconductor die 700 may be positioned in a face-down position such that on-die bump structures 788 face the on-interposer bump structures 388. Placement of the at least one semiconductor die 700 may be performed using a pick and place apparatus such that each of the on-die bump structures 788 may face a respective one of the on-interposer bump structures 388. Each set of at least one semiconductor die 700 may be placed within a respective unit area. Each DIB solder material portion 790 may be bonded to a respective on-die bump structure 788 and to a respective on-interposer bump structure 388.

Generally, a composite interposer (300, 400, 500) may be provided, which includes interposer bump structure 388 thereupon. At least one semiconductor die 700 may be provided, each of which includes a respective set of on-die bump structures 788. The at least one semiconductor die 700 may be bonded to the composite interposer (300, 400, 500) using the DIB solder material portions 790 that are bonded to a respective on-interposer bump structure 388 and to a respective on-die bump structure 788. Each set of at least one semiconductor die 700 may be attached to a respective composite interposer (300, 400, 500) through a respective set of DIB solder material portions 790.

In one embodiment, the on-die bump structures 788 and the on-interposer bump structures 388 may be configured for microbump bonding. In this embodiment, each of the on-die bump structures 788 and the on-interposer bump structures 388 may be configured as copper pillar structures having a diameter in a range from 10 microns to 50 microns, and may have a respective height in a range from 5 microns to 100 microns. The pitch of the microbumps in the direction of periodicity may be in a range from 20 microns to 100 microns, although lesser and greater pitches may also be used. Upon reflow, the lateral dimensions of each DIB solder material portion 790 may be in a range from 100% to 150% of the lateral dimension (such as a diameter) of the adjoined on-die bump structure 788 or of the adjoined on-interposer bump structure 388.

A die-side underfill material may be applied into each gap between the composite interposers (300, 400, 500) and sets of at least one semiconductor die 700 that are bonded to the composite interposers (300, 400, 500). The die-side underfill material may comprise any underfill material known in the art. A die-side underfill material portion 792 may be formed within each unit area between a composite interposer (300, 400, 500) and an overlying set of at least one semiconductor die 700. The die-side underfill material portions 792 may be formed by injecting the die-side underfill material around a respective array of DIB solder material portions 790 in a respective unit area. Any known underfill material application method may be used, which may be, for example, the capillary underfill method, the molded underfill method, or the printed underfill method.

In one embodiment, a plurality of semiconductor dies 700 may be attached to an organic interposer (such as a die-side organic interposer 500) through a respective array of solder material portions 790. In one embodiment, each of the plurality of semiconductor dies 700 comprises respective electrical nodes that are electrically connected to respective nodes within the LSI bridge 405.

Within each unit area, a die-side underfill material portion 792 may laterally surround, and contact, a respective set of the DIB solder material portions 790 within the unit area. The die-side underfill material portion 792 may be formed around, and contact, the DIB solder material portions 790, the on-interposer bump structures 388, and the on-die bump structures 788 in the unit area. Generally, at least one semiconductor die 700 comprising a respective set of on-die bump structures 788 is attached to the on-interposer bump structures 388 through a respective set of DIB solder material portions 790 within each unit area. Within each unit area, a die-side underfill material portion 792 laterally surrounds the on-interposer bump structures 388 and the on-die bump structures 788 of the at least one semiconductor die 700.

Figure 13:
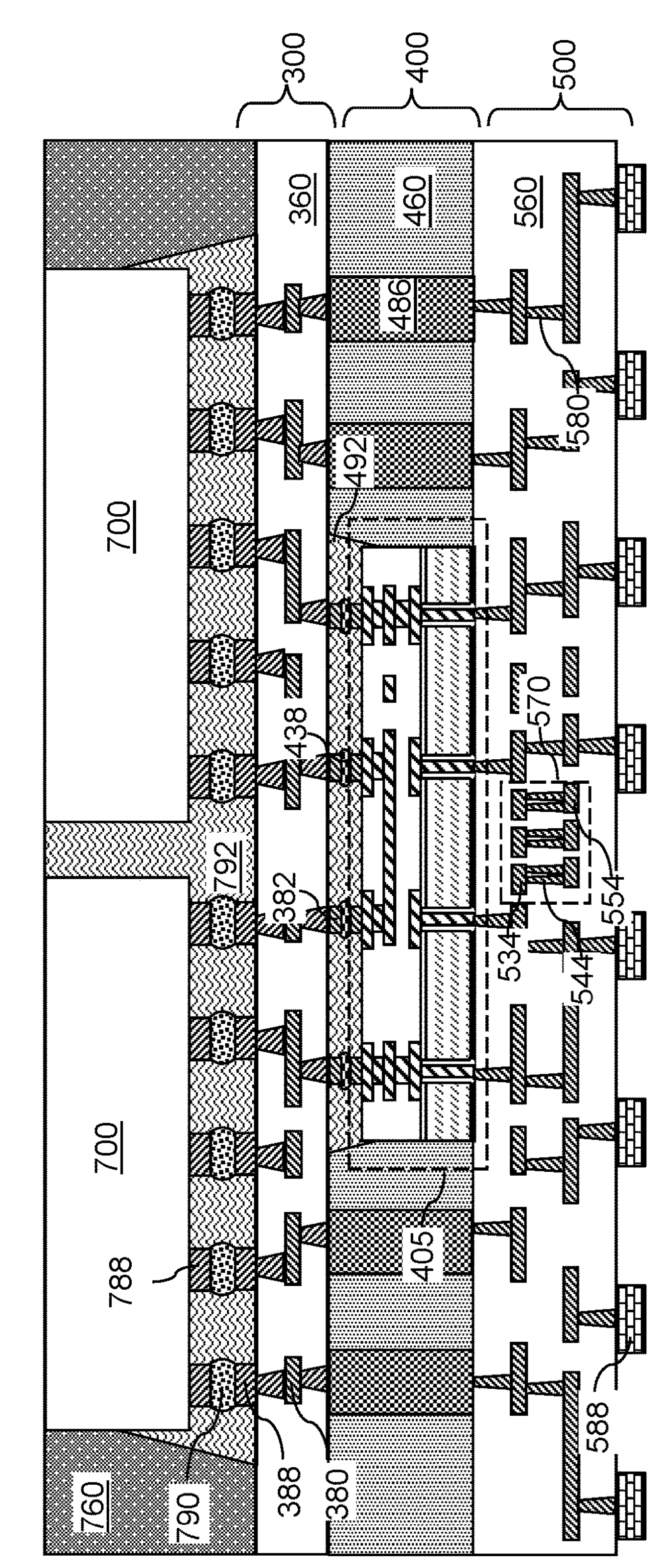
FIG. 13 is a vertical cross-sectional view of the intermediate structure after formation of a molding compound die frame, detaching the second carrier wafer, and dicing fan-out packages according to an embodiment of the present disclosure.

Referring to FIG. 13, a molding compound (MC) may be applied to the gaps between assemblies of a respective set of at least one semiconductor die 700 and a respective die-side underfill material portion 792. The MC may include any material that may be used for the MC interposer frames 460 discussed above. The MC may include epoxy resin, hardener, silica (as a filler material), and other additives. The MC may be cured at a curing temperature to form an MC matrix, which is herein referred to as a die-level MC matrix or as a second MC matrix 760. The die-level MC matrix laterally surrounds and embeds each assembly of a set of at least one semiconductor die 700 and a die-side underfill material portion 792. The die-level MC matrix 760 includes a plurality of molding compound (MC) die frames that may be laterally adjoined to one another. Each MC die frame 760 is a portion of the die-level MC matrix that is located within a respective unit area. Thus, each MC die frame 760 laterally surrounds, and embeds, a respective a set of at least one semiconductor die 700 and a respective die-side underfill material portion 792.

Portions of the die-level MC matrix that overlies the horizontal plane including the top surfaces of the at least one semiconductor die 700 may be removed by a planarization process. For example, the portions of the die-level MC matrix that overlies the horizontal plane may be removed using a chemical mechanical planarization (CMP). The reconstituted wafer that overlies the second carrier wafer 620 comprises a combination of the die-level MC matrix, the at least one semiconductor die 700, the die-side underfill material portions 792, and the two-dimensional array of composite interposers (300, 400, 500). Each portion of the die-level MC matrix located within a unit area constitutes an MC die frame.

Each portion of the reconstituted wafer located within a unit area constitutes a fan-out package 800. Each fan-out package 800 may comprise at least one semiconductor die 700, a composite interposer (300, 400, 500), DIB solder material portions 790, at least one die-side underfill material portion 792, and an MC die frame 760 that is a portion of the die-level MC matrix located within a respective unit area.

The second carrier wafer 620 may be detached from the reconstituted wafer. In one embodiment, the second carrier wafer 620 includes an optically transparent material and the second adhesive layer 621 comprises a light-to-heat conversion material, irradiation through the second carrier wafer 620 may be used to detach the second carrier wafer 620. In embodiments in which the second adhesive layer 621 comprises a thermally decomposable adhesive material, an anneal process or a laser irradiation may be used to detach the second carrier wafer 620. A suitable clean process may be performed to remove residual portions of the second adhesive layer 621. The interposer bonding pads 588 of the composite interposers (300, 400, 500) may be physically exposed.

The reconstituted wafer includes a two-dimensional array of composite interposers (300, 400, 500), and further includes a two-dimensional array of sets of at least one semiconductor die 700 that are bonded to a respective composite interposer (300, 400, 500). The reconstituted wafer may be diced along dicing channels by performing a dicing process. The dicing channels correspond to the boundaries between neighboring pairs of unit areas. Each diced unit from the reconstituted wafer comprises a fan-out package 800. In other words, each diced portion of the assembly of the two-dimensional array of sets of at least one semiconductor die 700, the two-dimensional array of die-side underfill material portions 792, the die-level MC matrix, and the two-dimensional array of composite interposers (300, 400, 500) comprises a fan-out package 800. Each diced portion of the die-level MC matrix constitutes a molding compound die frame 760, i.e., an MC die frame 760. Generally, an assembly comprising at least one semiconductor die 700 and a composite interposer (such as a composite interposer (300, 400, 500)) may be provided. A fan-out package 800 constitutes such an assembly.

Figure 14:
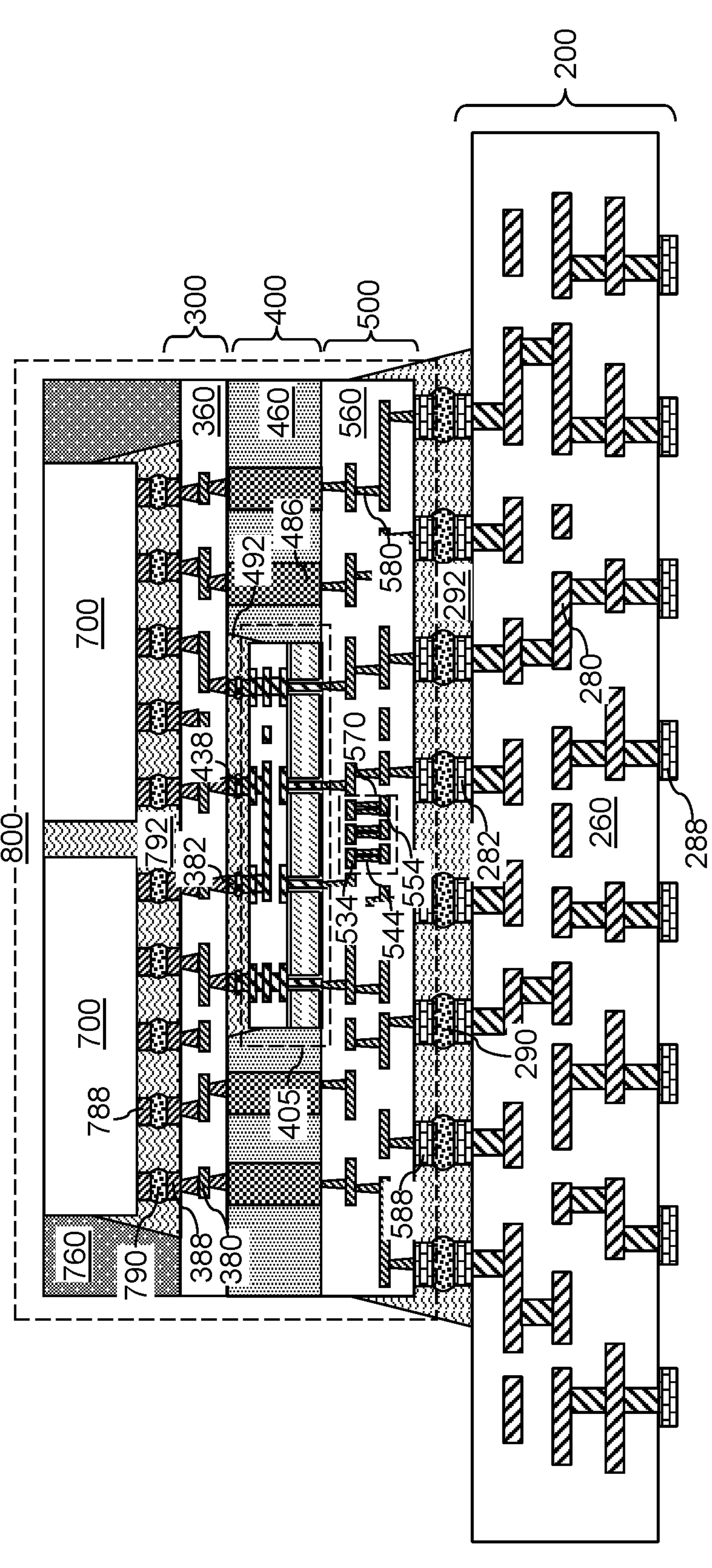
FIG. 14 is a vertical cross-sectional view of the intermediate structure after attaching a packaging substrate to the fan-out package according to an embodiment of the present disclosure.

Referring to FIG. 14, a packaging substrate 200 according to an embodiment of the present disclosure may be provided. The packaging substrate 200 may be a cored packaging substrate including a core substrate, or a coreless packaging substrate that does not include a package core. Alternatively, the packaging substrate 200 may include a system-on-integrated packaging substrate (SoIS) including redistribution layers. dielectric interlayers, and/or at least one embedded interposer (such as a silicon interposer). Such a system-integrated packaging substrate may include layer-to-layer interconnections using solder material portions, microbumps, underfill material portions (such as molded underfill material portions), and/or an adhesion film. It is understood that the scope of the present disclosure is not limited by any particular type of substrate package. For example, an SoIS may be used in lieu of a cored packaging substrate. In embodiments in which SoIS is used, the core substrate may include a glass epoxy plate including an array of through-plate holes.

In one embodiment, the package substrate 200 may comprise substrate redistribution dielectric layers 260 embedding substrate redistribution wiring interconnects 280. In one embodiment, the packaging substrate 200 may include board-side surface laminar circuit (SLC) and a chip-side surface laminar circuit (SLC). An array of package-side bonding pads 282 may be provided on the side of the packaging substrate 200 that faces the fan-out package 800. An array of board-side bonding pads 288 may be formed on the side of the packaging substrate 200 that is subsequently connected to a printed circuit board. The array of board-side bonding pads 288 is configured to allow bonding through solder joints having a greater dimension than the C4 solder balls.

The assembly including the fan-out package 800 may be attached to the packaging substrate 200 using an array of solder material portions 290. Specifically, each of the solder material portions 290 may be bonded to a respective one of the interposer-side bonding pads 588 and to a respective one of package-side bonding pads 282. A reflow process may be performed to reflow the solder material portions 290 during the bonding process.

An underfill material may be applied into a gap between the composite interposer (300, 400, 500) and the packaging substrate 200. The underfill material may comprise any underfill material known in the art. An underfill material portion may be formed around the array of solder material portions 290 in the gap between the composite interposer (300, 400, 500) and the packaging substrate 200. This underfill material portion is formed between the composite interposer (300, 400, 500) and the packaging substrate 200, and thus, is herein referred to as an interposer-package underfill material portion 292, or as an IP underfill material portion 292.

Figure 15:
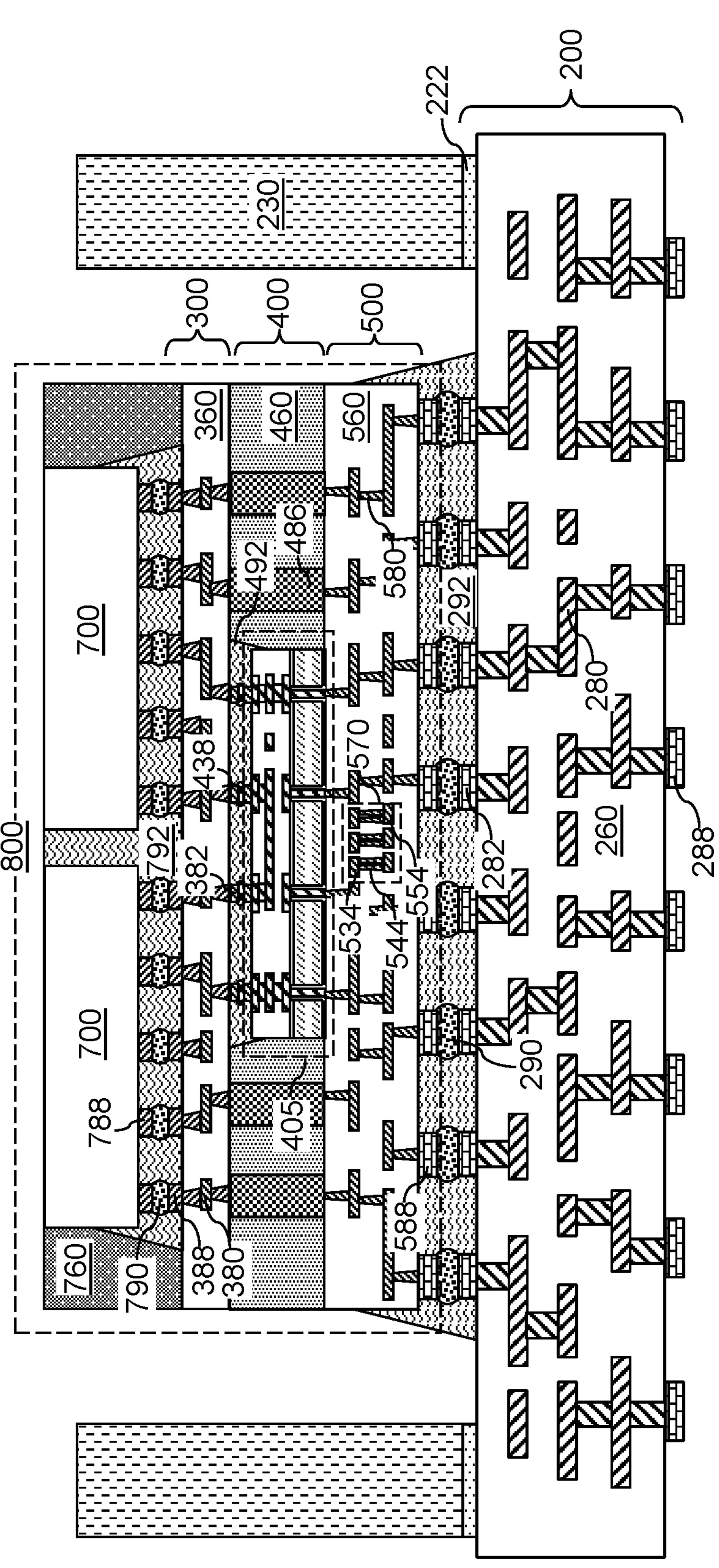
FIG. 15 is a vertical cross-sectional view of the intermediate structure after attaching a stiffener ring according to an embodiment of the present disclosure.

Referring to FIG. 15, a stiffener ring 230 may be optionally attached to the packaging substrate 200 using, for example, an adhesive layer 222.

Figure 16:
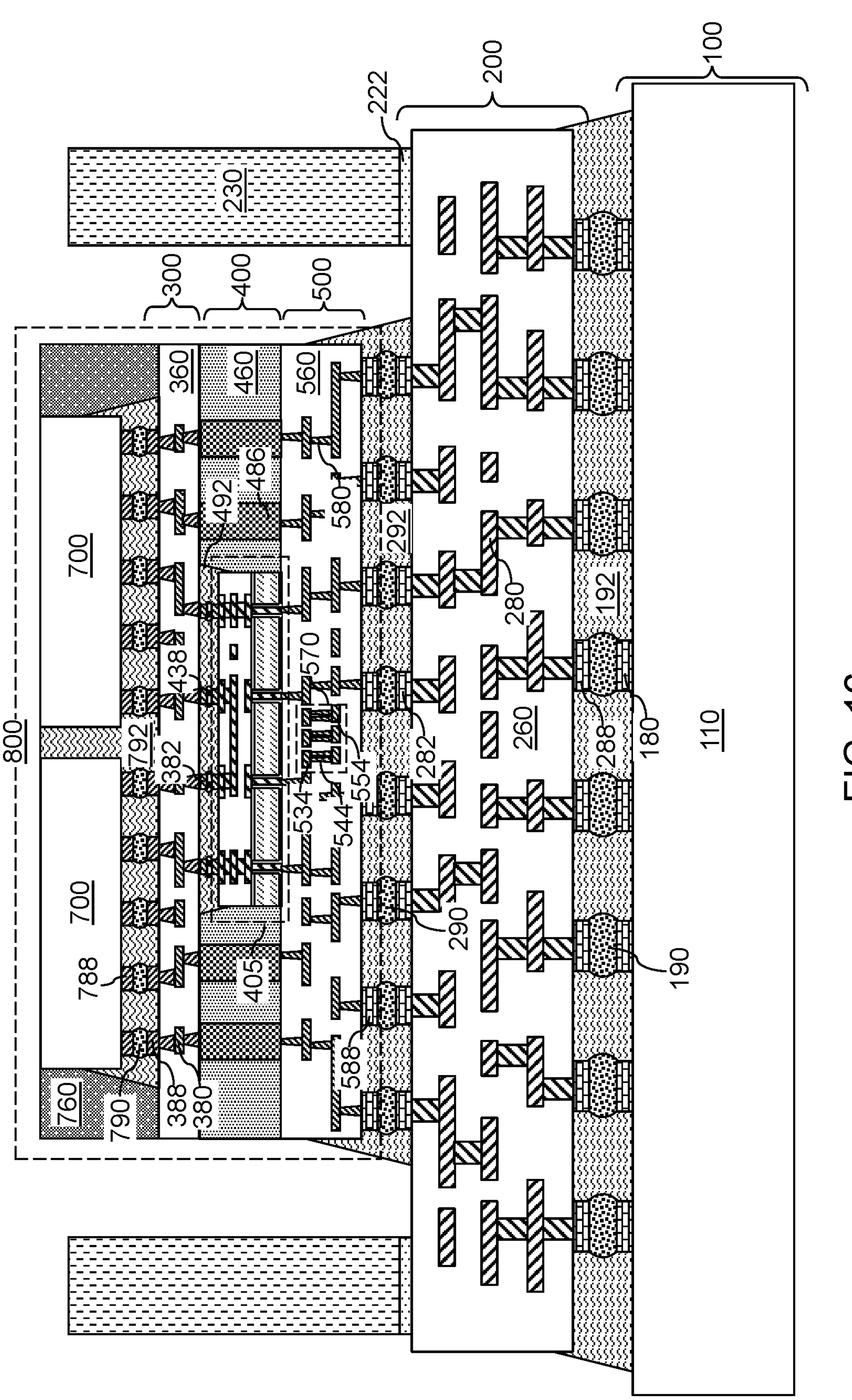
FIG. 16 is a vertical cross-sectional view of the structure after attaching the packaging substrate to a printed circuit board according to an embodiment of the present disclosure.

Referring to FIG. 16, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 288 to the array of PCB bonding pads 180. The solder joints 190 may be formed by disposing an array of solder balls between the array of board-side bonding pads 288 and the array of PCB bonding pads 180, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 100 through the array of solder joints 190.

Generally, a printed circuit board 100 may be bonded to the packaging substrate 200 through an array of solder joints 190. An additional underfill material portion (such as the board-substrate underfill material portion 192) may be formed between the printed circuit board 100 and the packaging substrate 200, and may laterally surround the solder joints 190.

Figure 17:
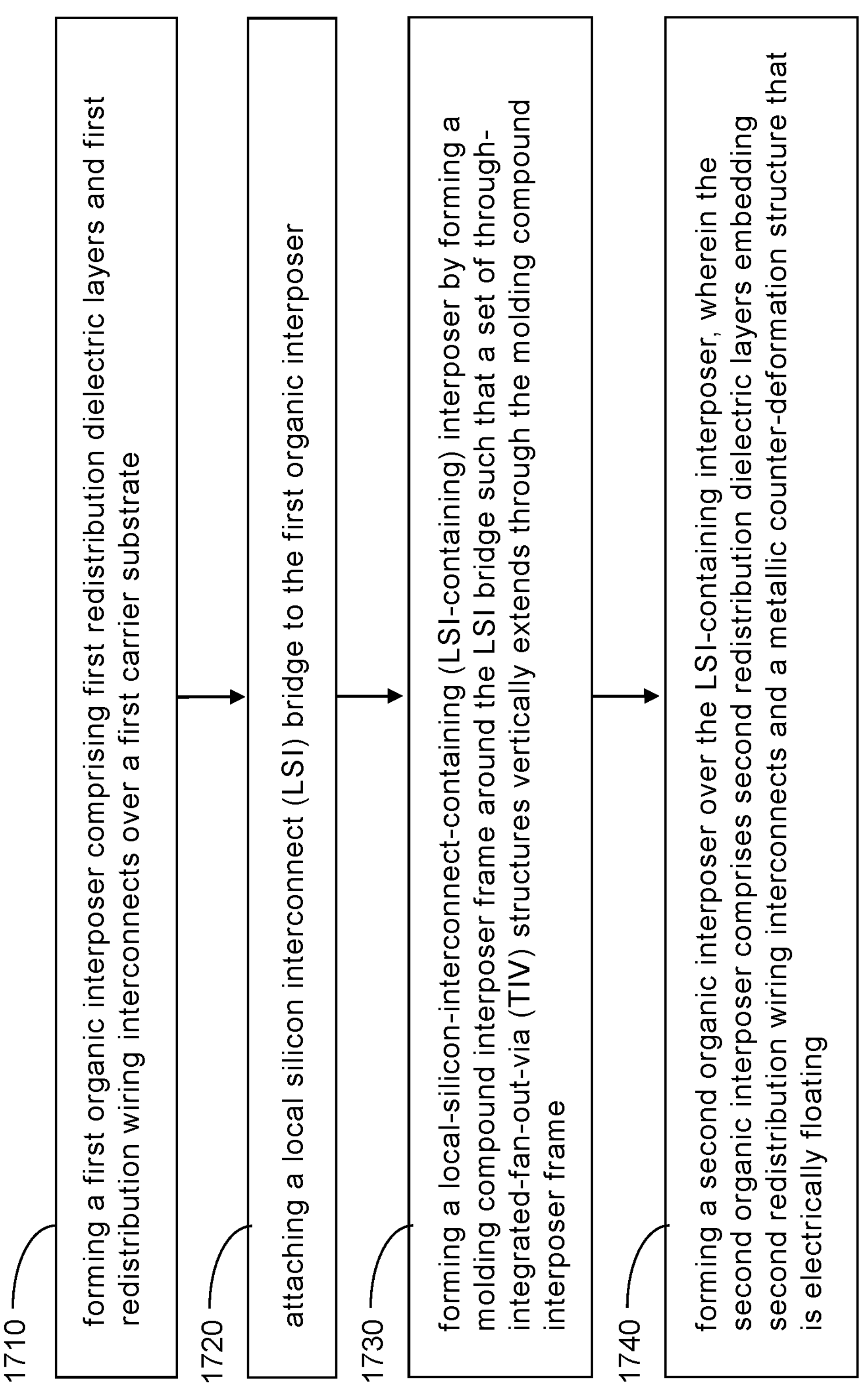
FIG. 17 is a flowchart illustrating steps for forming a structure according to an embodiment of the present disclosure.

FIG. 17 is a flowchart illustrating steps for forming an exemplary structure according to an embodiment of the present disclosure.

Referring to step 1710 and FIG. 1, a first organic interposer (such as a die-side organic interposer 300) comprising first redistribution dielectric layers (such as die-side redistribution dielectric layers 360) and first redistribution wiring interconnects (such as die-side redistribution wiring interconnects 380) may be formed over a first carrier substrate 610.

Referring to step 1720 and FIGS. 2 and 3, a local silicon interconnect (LSI) bridge 405 may be attached to the first organic interposer (such as the die-side organic interposer 300).

Referring to step 1730 and FIG. 4, a local-silicon-interconnect-containing (LSI-containing) interposer 400 may be formed by forming a molding compound interposer frame 460 around the LSI bridge 405 such that a set of through-integrated-fan-out-via (TIV) structures 486 vertically extends through the molding compound interposer frame 460.

Referring to step 1740 and FIGS. 5-16, a second organic interposer (such as a substrate-side organic interposer 500) may be formed over the LSI-containing interposer 400. The second organic interposer 500 comprises second redistribution dielectric layers (such as substrate-side redistribution dielectric layers 560) embedding second redistribution wiring interconnects (such as substrate-side redistribution wiring interconnects 580) and a metallic counter-deformation structure 570 that is electrically floating. The metallic counter-deformation structure 570 comprises: a plurality of metallic via structures 544; a proximal metallic plate 534 that contacts the plurality of metallic via structures 544 and is more proximal to the LSI-containing interposer 400 than the plurality of metallic via structures 544 is to the LSI-containing interposer 400; and a distal metallic plate 554 that contacts the plurality of metallic via structures 544 and is more distal from the LSI-containing interposer 400 than the respective plurality of metallic via structures 544 is to the LSI-containing interposer 400.

Referring to all drawings and according to various embodiments of the present disclosure, a semiconductor structure comprising a composite interposer (300, 400, 500) is provided. The composite interposer (300, 400, 500) comprises: a local-silicon-interconnect-containing (LSI-containing) interposer 400 that comprises a local silicon interconnect (LSI) bridge 405, a set of through-integrated-fan-out-via (TIV) structures 486 laterally surrounding the LSI bridge 405, and a molding compound interposer frame 460 that laterally surrounds the LSI bridge 405 and the TIV structures 486; and an organic interposer (such as a substrate-side organic interposer 500) located on the LSI-containing interposer 400 and comprising redistribution dielectric layers (such as substrate-side redistribution dielectric layers 560) embedding redistribution wiring interconnects (such as substrate-side redistribution wiring interconnects 580) and metallic counter-deformation structures 570 that are electrically floating. In one embodiment, each of the metallic counter-deformation structures 570 comprises: a respective plurality of metallic via structures 544; a respective proximal metallic plate 534 that contacts the respective plurality of metallic via structures 544 and is more proximal to the LSI-containing interposer 400 than the respective plurality of metallic via structures 544 is to the LSI-containing interposer 400; and a respective distal metallic plate 554 that contacts the respective plurality of metallic via structures 544 and is more distal from the LSI-containing interposer 400 than the respective plurality of metallic via structures 544 is to the LSI-containing interposer 400.

In one embodiment, a subset of the redistribution wiring interconnects (such as substrate-side redistribution wiring interconnects 580) is in direct contact with a subset of metallic structures (such as through-silicon via structures 414) of the LSI bridge 405. In one embodiment, the subset of metallic structures comprises a plurality of through-silicon via (TSV) structures 414 that vertically extends through a silicon substrate 410 of the LSI bridge 405. In one embodiment, a surface of the redistribution dielectric layers (such as substrate-side redistribution dielectric layers 560) is in direct contact with the LSI bridge 405. In one embodiment, at least one metallic counter-deformation structure 570 selected from the metallic counter-deformation structures 570 comprises: a first portion having an areal overlap with the LSI bridge 405 in a plan view along a direction that is perpendicular to an interface between the LSI-containing interposer 400 and the organic interposer (such as a substrate-side organic interposer 500); and a second portion that does not have any areal overlap within the LSI bridge 405 in the plan view. In one embodiment, the LSI bridge 405 comprises two pairs of sidewalls; and the metallic counter-deformation structures 570 have an areal overlap within at least two sidewalls selected from the two pairs of sidewalls in a plan view along a direction that is perpendicular to an interface between the LSI-containing interposer 400 and the organic interposer (such as a substrate-side organic interposer 500). In one embodiment, the composite interposer (300, 400, 500) comprises an additional organic interposer (such as a die-side organic interposer 300) located on the LSI-containing interposer 400 on an opposite side of the organic interposer (such as a substrate-side organic interposer 500) and comprising additional redistribution dielectric layers (such as die-side redistribution dielectric layers 360) embedding additional redistribution wiring interconnects (such as die-side redistribution wiring interconnects 380). In one embodiment, the LSI bridge 405 is bonded to the additional organic interposer (such as a die-side organic interposer 300) through an array of solder material portions 438. In one embodiment, the LSI-containing interposer 400 comprises an embedded underfill material portion 492 laterally surrounding the array of solder material portions 438 and laterally surrounded by the molding compound interposer frame 460. In one embodiment, the semiconductor structure comprises a plurality of semiconductor dies 700 bonded to the composite interposer (300, 400, 500) through a respective array of solder material portions 790, wherein each of the plurality of semiconductor dies 700 comprises electrical nodes that are electrically connected to respective nodes within the LSI bridge 405.

According to another aspect of the present disclosure, a semiconductor structure comprising a composite interposer (300, 400, 500) is provided. The composite interposer (300, 400, 500) comprises: a local-silicon-interconnect-containing (LSI-containing) interposer 400 that comprises a local silicon interconnect (LSI) bridge 405; and an organic interposer (such as a substrate-side organic interposer 500) located on the LSI-containing interposer 400, comprising redistribution dielectric layers (such as substrate-side redistribution dielectric layers 560) embedding redistribution wiring interconnects (such as substrate-side redistribution wiring interconnects 580) and a metallic counter-deformation structure 570, wherein the metallic counter-deformation structure 570 comprises: a plurality of metallic via structures 544; a first metallic plate 534 located on a first side of the plurality of metallic via structures 544; and a second metallic plate 554 located on a second side of the plurality metallic via structures 544 and vertically spaced from the first metallic plate 534.

In one embodiment, each of the metallic counter-deformation structure 570 is electrically floating, and is electrically isolated from each of the redistribution wiring interconnects (such as substrate-side redistribution wiring interconnects 580). In one embodiment, the first metallic plate 534 comprises a first portion having an areal overlap within the second metallic plate 554 in a plan view along a direction that is perpendicular to an interface with the LSI-containing interposer 400 and the organic interposer (such as a substrate-side organic interposer 500), and a second portion that does not have any areal overlap with the second metallic plate 554 in the plan view; and the second metallic plate 554 comprises a portion that does not have any areal overlap with the first metallic plate 534 in the plan view. In one embodiment, the first metallic plate 534 comprises at least one first opening therein; the second metallic plate 554 comprises at least one second opening therein; and the at least one second opening has an areal overlap with the at least one first opening in a plan view along a direction that is perpendicular to an interface with the LSI-containing interposer 400 and the organic interposer (such as a substrate-side organic interposer 500). In one embodiment, the metallic counter-deformation structure 570 comprises: a first portion having an areal overlap with the LSI bridge 405 in a plan view along a direction that is perpendicular to an interface between the LSI-containing interposer 400 and the organic interposer (such as a substrate-side organic interposer 500); and a second portion that does not have any areal overlap within the LSI bridge 405 in the plan view.

Various embodiments of the present disclosure uses counter-deformation structures 570 located within at least one support region R in a composite interposer (300, 400, 500). Each support region R has an area having a respective partial overlap or a full overlap with the area of a local silicon interconnect (LSI) bridge 405. Mechanical stress generated by, and/or around, the LSI bridge 405 may be mitigated by the counter-deformation structures 570 in the at least one support region R. The counter-deformation structures 570 redistributes mechanical stress that is concentrated around areas of the edges of the LSI bridge 405 over a wider area, and increases the process yield and the reliability for the composite interposer (300, 400, 500).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising a composite interposer, wherein the composite interposer comprises:

a local-silicon-interconnect-containing (LSI-containing) interposer that comprises a local silicon interconnect (LSI) bridge, a set of through-integrated-fan-out-via (TIV) structures laterally surrounding the LSI bridge, and a molding compound interposer frame that laterally surrounds the LSI bridge and the TIV structures; and an organic interposer located on the LSI-containing interposer and comprising redistribution dielectric layers embedding redistribution wiring interconnects and metallic counter-deformation structures that are electrically floating, wherein each of the metallic counter-deformation structures comprises:

a respective plurality of metallic via structures;

a respective proximal metallic plate that contacts the respective plurality of metallic via structures and is more proximal to the LSI-containing interposer than the respective plurality of metallic via structures is to the LSI-containing interposer; and a respective distal metallic plate that contacts the respective plurality of metallic via structures and is more distal from the LSI-containing interposer than the respective plurality of metallic via structures is to the LSI-containing interposer, and wherein a subset of the redistribution wiring interconnects is in direct contact with a subset of metallic structures of the LSI bridge.

2. The semiconductor structure of claim 1, wherein the subset of metallic structures comprises a plurality of through-silicon via (TSV) structures that vertically extends through a silicon substrate of the LSI bridge.

3. The semiconductor structure of claim 1, wherein a surface of the redistribution dielectric layers is in direct contact with the LSI bridge.

4. The semiconductor structure of claim 1, wherein at least one metallic counter-deformation structure selected from the metallic counter-deformation structures comprises:

a first portion having an areal overlap with the LSI bridge in a plan view along a direction that is perpendicular to an interface between the LSI-containing interposer and the organic interposer; and a second portion that does not have any areal overlap within the LSI bridge in the plan view.

5. The semiconductor structure of claim 1, wherein:

the LSI bridge comprises two pairs of sidewalls; and the metallic counter-deformation structures have an areal overlap within at least two sidewalls selected from the two pairs of sidewalls in a plan view along a direction that is perpendicular to an interface between the LSI-containing interposer and the organic interposer.

6. The semiconductor structure of claim 1, wherein the composite interposer comprises an additional organic interposer located on the LSI-containing interposer on an opposite side of the organic interposer and comprising additional redistribution dielectric layers embedding additional redistribution wiring interconnects.

7. The semiconductor structure of claim 6, wherein the LSI bridge is bonded to the additional organic interposer through an array of microbumps.

8. The semiconductor structure of claim 7, wherein the LSI-containing interposer comprises an embedded underfill material portion laterally surrounding the array of microbumps and laterally surrounded by the molding compound interposer frame.

9. The semiconductor structure of claim 1, further comprising a plurality of semiconductor dies bonded to the composite interposer through a respective array of solder material portions, wherein each of the plurality of semiconductor dies comprises electrical nodes that are electrically connected to respective nodes within the LSI bridge.

10. A semiconductor structure comprising a composite interposer, wherein the composite interposer comprises:

a local-silicon-interconnect-containing (LSI-containing) interposer that comprises a local silicon interconnect (LSI) bridge; and an organic interposer located on the LSI-containing interposer, comprising redistribution dielectric layers embedding redistribution wiring interconnects and a metallic counter-deformation structure, wherein the metallic counter-deformation structure comprises:

a plurality of metallic via structures;

a first metallic plate located on a first side of the plurality of metallic via structures; and a second metallic plate located on a second side of the plurality metallic via structures and vertically spaced from the first metallic plate, wherein the metallic counter-deformation structure is electrically floating and is electrically isolated from each of the redistribution wiring interconnects.

11. The semiconductor structure of claim 10, wherein each of the metallic counter-deformation structures is electrically floating, and is electrically isolated from each of the redistribution wiring interconnects.

12. The semiconductor structure of claim 10, wherein:

the first metallic plate comprises a first portion having an areal overlap within the second metallic plate in a plan view along a direction that is perpendicular to an interface with the LSI-containing interposer and the organic interposer, and a second portion that does not have any areal overlap with the second metallic plate in the plan view; and the second metallic plate comprises a portion that does not have any areal overlap with the first metallic plate in the plan view.

13. The semiconductor structure of claim 10, wherein:

the first metallic plate comprises at least one first opening therein;

the second metallic plate comprises at least one second opening therein; and the at least one second opening has an areal overlap with the at least one first opening in a plan view along a direction that is perpendicular to an interface with the LSI-containing interposer and the organic interposer.

14. The semiconductor structure of claim 10, wherein the metallic counter-deformation structure comprises:

a first portion having an areal overlap with the LSI bridge in a plan view along a direction that is perpendicular to an interface between the LSI-containing interposer and the organic interposer; and a second portion that does not have any areal overlap within the LSI bridge in the plan view.

15. A semiconductor structure comprising a composite interposer, wherein the composite interposer comprises:

a local-silicon-interconnect-containing (LSI-containing) interposer that comprises a local silicon interconnect (LSI) bridge, a set of through-integrated-fan-out-via (TIV) structures laterally surrounding the LSI bridge, and a molding compound interposer frame that laterally surrounds the LSI bridge and the TIV structures; and an organic interposer located on the LSI-containing interposer and comprising redistribution dielectric layers embedding redistribution wiring interconnects and metallic counter-deformation structures that are electrically floating, wherein each of the metallic counter-deformation structures comprises a respective proximal metallic plate and a respective distal metallic plate that are interconnected to each other by a respective plurality of metallic via structures, and wherein the LSI bridge comprises a dielectric liner comprising vertically-extending portions that laterally surround through-silicon via structures within the LSI bridge and a horizontally-extending portion that contacts the organic interposer.

16. The semiconductor structure of claim 15, wherein the respective proximal metallic plate is vertical spaced from an interface between the LSI-containing interposer and the organic interposer.

17. The semiconductor structure of claim 15, wherein the respective distal metallic plate is vertically spaced from a horizontal plane including a horizontal surface of the redistribution dielectric layers that is most distal from the LSI-containing interposer.

18. The semiconductor structure of claim 15, wherein sidewalls of the molding compound interposer frame are vertically coincident with sidewalls of the organic interposer.

19. The semiconductor structure of claim 10, wherein a periphery of the second metallic plate is laterally offset from a periphery of the first metallic plate in a plan view along a direction that is perpendicular to an interface between the LSI-containing interposer and the organic interposer.

20. The semiconductor structure of claim 10, wherein the plurality of metallic via structures is located entirely within an area of an overlap between the second metallic plate and the first metallic plate in a plan view along a direction that is perpendicular to an interface between the LSI-containing interposer and the organic interposer.

* * * * *